US010423208B2

United States Patent
Ogushi et al.

(10) Patent No.: US 10,423,208 B2
(45) Date of Patent: Sep. 24, 2019

(54) PRINTING APPARATUS AND CONTROL METHOD OF PRINTING APPARATUS

(71) Applicant: CANON KABUSHIKI KAISHA, Tokyo (JP)

(72) Inventors: Takuhiro Ogushi, Yokohama (JP); Yosuke Ezumi, Moriya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/100,627

(22) Filed: Aug. 10, 2018

(65) Prior Publication Data

US 2019/0064905 A1 Feb. 28, 2019

(30) Foreign Application Priority Data

Aug. 24, 2017 (JP) .................. 2017-161499

(51) Int. Cl.
| | |
|---|---|
| G06F 1/30 | (2006.01) |
| G06K 15/00 | (2006.01) |
| G06F 3/12 | (2006.01) |
| G06F 1/14 | (2006.01) |
| B41J 29/38 | (2006.01) |

(Continued)

(52) U.S. Cl.
CPC ............. *G06F 1/305* (2013.01); *B41J 29/38* (2013.01); *B41J 29/393* (2013.01); *G06F 1/14* (2013.01); *G06F 1/26* (2013.01); *G06F 1/30* (2013.01); *G06F 3/1229* (2013.01); *G06K 15/4055* (2013.01); *G06F 1/266* (2013.01); *H02J 9/061* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 6,968,207 | B1 | 11/2005 | Ezumi |
| 2005/0200313 | A1 | 9/2005 | Teradaira |

(Continued)

FOREIGN PATENT DOCUMENTS

| | | |
|---|---|---|
| EP | 2 392 987 | 12/2011 |
| JP | 4-354011 | 12/1992 |

(Continued)

OTHER PUBLICATIONS

European Search Report dated Jan. 23, 2019 during prosecution of related European application No. 18188305.9.

*Primary Examiner* — Lennin R Rodriguezgonzalez
(74) *Attorney, Agent, or Firm* — Venable LLP

(57) ABSTRACT

The printing apparatus of the present invention is a printing apparatus including: a power source switch that switches a power source to on or off; a control circuit configured to control supply or shutoff of power from the power source; and a measurement unit configured to measure a predetermined set time after the power source switch is switched to off, and the predetermined set time is set in accordance with processing being performed, and the control circuit performs control, in a case where the power source switch is switched to off, so as to shut off supply of power from the power source in accordance with completion of termination preparation of the processing being performed or completion of measurement of the predetermined set time in the measurement unit.

26 Claims, 17 Drawing Sheets

(51) Int. Cl.
*B41J 29/393* (2006.01)
*G06F 1/26* (2006.01)
*H02J 9/06* (2006.01)
*H03K 17/687* (2006.01)

(56) References Cited

U.S. PATENT DOCUMENTS

2012/0080944 A1\* 4/2012 Recker ............... H02J 9/02
 307/25
2015/0172492 A1\* 6/2015 Eguchi ............ H04N 1/00888
 358/1.13
2015/0338898 A1 11/2015 Yoshida

FOREIGN PATENT DOCUMENTS

| JP | 10-278381 | 10/1998 |
| JP | 2011-81603 | 4/2011 |
| JP | 2017-163257 | 9/2017 |

\* cited by examiner

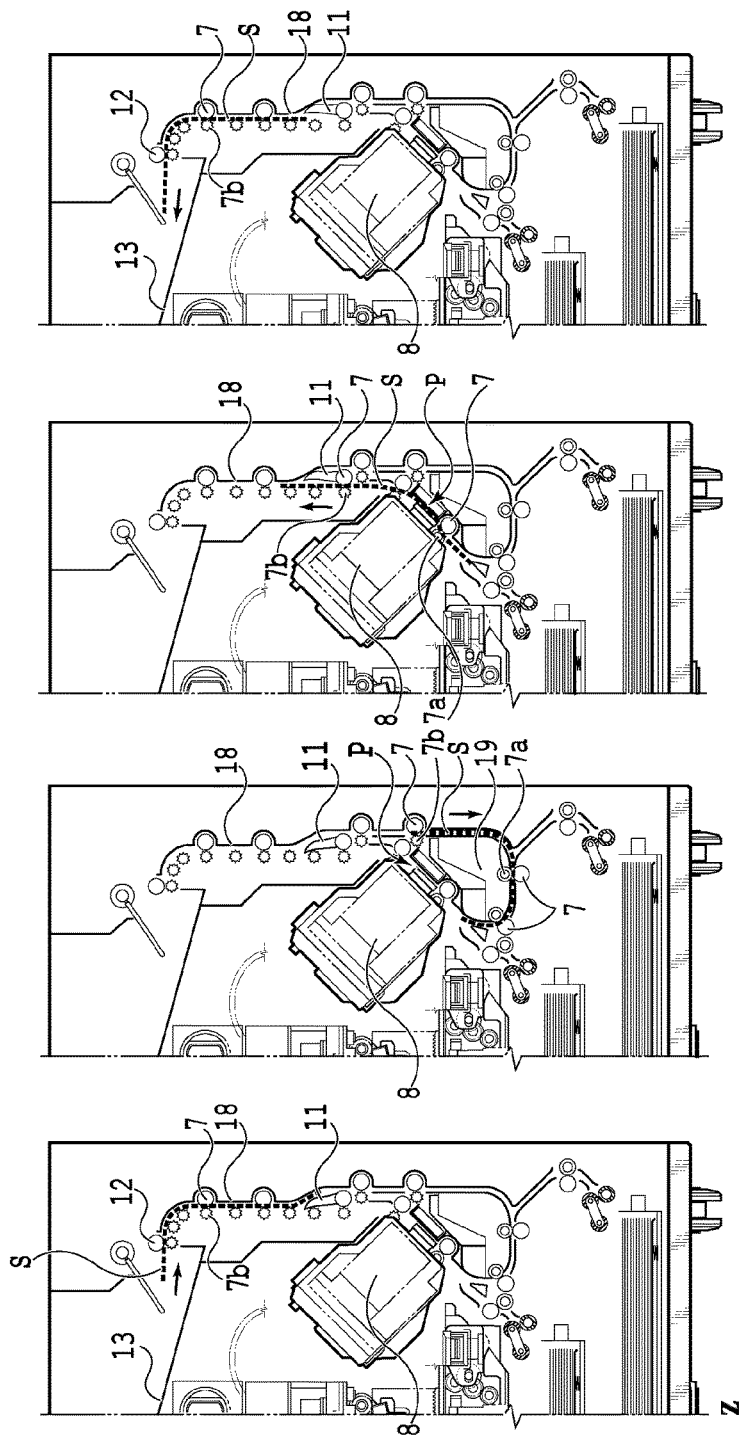

| NO. | Processing being performed | Time required in the case where terminated on the way (process) | Time required in the case where terminated on the way (firmware) | Timer set time |
|---|---|---|---|---|
| 1 | ink circulation | 20 sec. | 10 sec. | 30 sec. |
| 2 | blade wiping | 40 sec. | 10 sec. | 50 sec. |
| 3 | vacuum wiping | | | |
| 4 | charge suction | 50 sec. | 10 sec. | 60 sec. |

FIG.13

PRINTING APPARATUS AND CONTROL METHOD OF PRINTING APPARATUS

BACKGROUND OF THE INVENTION

Field of the Invention

The present invention relates to a printing apparatus and a control method of a printing apparatus.

Description of the Related Art

Conventionally, as a printing apparatus, one is known which is capable of shutting off supply of power source without fail even in the case where the power source switch is switched to off suddenly and it is no longer possible to control a controller (CPU) that controls the printing apparatus because the controller runs out of control and the like.

For example, in Japanese Patent Laid-Open No. H10-278381(1998), a printing apparatus has been disclosed which is capable of turning off the power source without fail by using a timer even in the case where it is no longer possible to control the CPU because the CPU runs out of control and the like. In this printing apparatus, in the case where an off signal of the power source switch is input to the CPU and the timer, the CPU turns off the power source after printing is completed in the case where printing is being performed, and the timer turns off the power source after measuring a predetermined time by outputting a power source off control signal to the power source control unit.

Further, by setting the predetermined time that is measured by the timer to a time longer than the printing time or the data transmission completion time, it is possible to turn off the power source without fail after completion of printing even in the case where the power source is turned off during printing and it is also possible to deal with the out of control of the CPU.

However, in the printing apparatus of Japanese Patent Laid-Open No. H10-278381(1998), the measurement time of the timer is set as a fixed value based on the printing time. Because of this, even in the case where the printing apparatus is not in the printing state, on a condition that the CPU runs out of control, it is necessary to stand by for the measurement time of the timer, which is set to a time longer than the printing time, until the power source is turned off, and therefore, it is not possible to immediately turn off the power source in case of emergency. As a result, there is a concern that the printing apparatus (for example, the drive mechanism and the like of the printing apparatus) is damaged.

The present invention has been made in view of the conventional problem and an object thereof is to guarantee reliability and safety of a printing apparatus by shutting off the power source in accordance with processing.

SUMMARY OF THE INVENTION

The present invention is a printing apparatus including: a power source switch that switches a power source to on or off; a control circuit configured to control supply or shutoff of power from the power source; and a measurement unit configured to measure a predetermined set time after the power source switch is switched to off, and the predetermined set time is set in accordance with processing being performed, and the control circuit performs control, in a case where the power source switch is switched to off, so as to shut off supply of power from the power source in accordance with completion of termination preparation of the processing being performed or completion of measurement of the predetermined set time in the measurement unit.

Further features of the present invention will become apparent from the following description of exemplary embodiments with reference to the attached drawings.

BRIEF DESCRIPTION OF THE DRAWINGS

FIG. 6A to FIG. 6D are conveyance path diagrams in the case where a printing operation is performed on the backside of a printing medium;

FIG. 11 is a diagram showing the relationship of FIG. 11A and FIG. 11B;

FIG. 13 is a diagram showing processing being performed in the printing apparatus and a count time that is set in accordance with the processing;

DESCRIPTION OF THE EMBODIMENTS

In the following, with reference to the drawings, a printing apparatus according to an embodiment of the present invention is explained. The following embodiment is not intended to limit the present invention and all combinations of features explained in the present embodiment are not necessarily indispensable to the solution of the present invention. Further, in the present embodiment, as a printing apparatus, an ink jet printing apparatus is explained as an example thereof <About Internal Configuration of Printing Apparatus>

Figure 1:
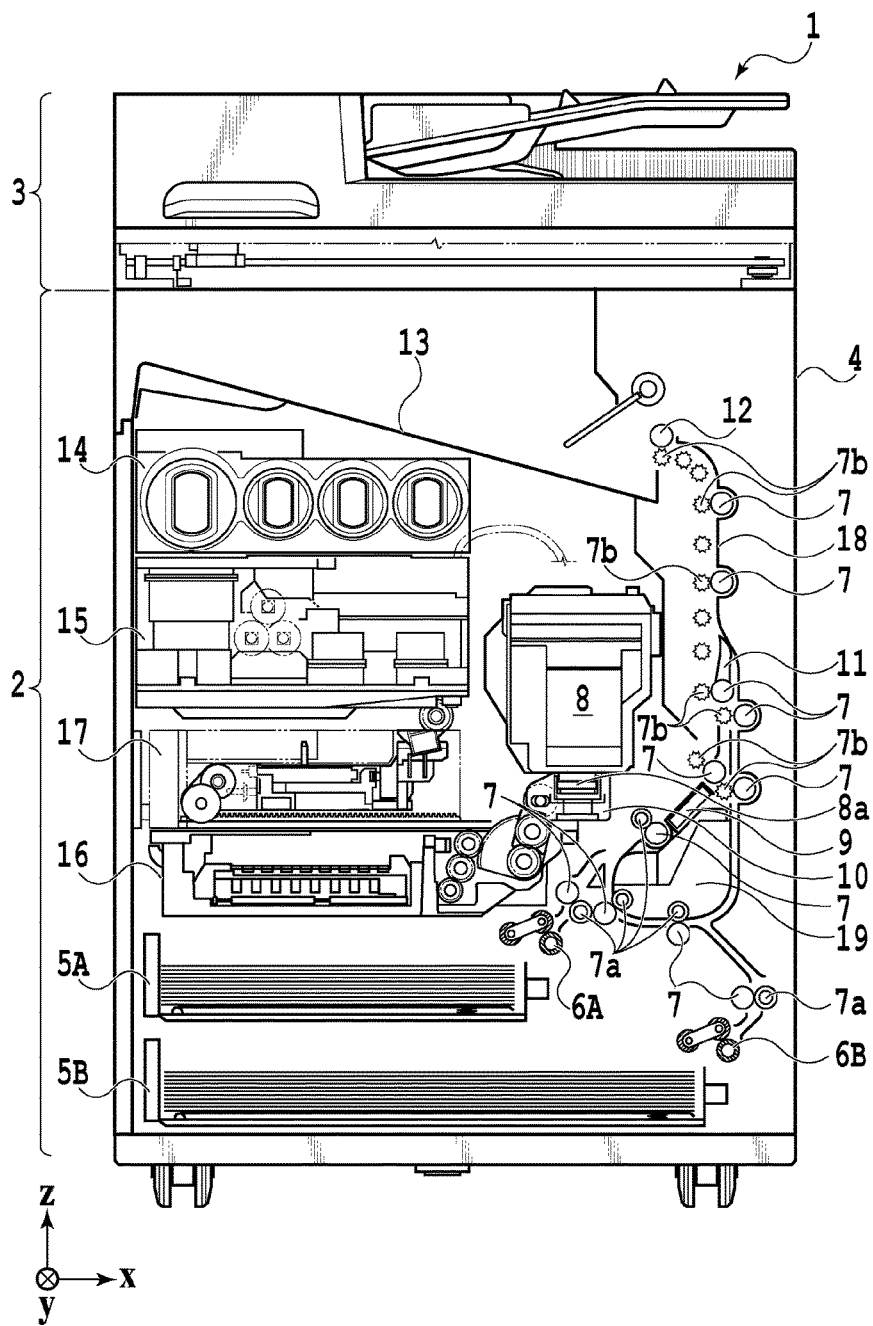
FIG. 1 is a diagram in the case where a printing apparatus is in a standby state.

FIG. 1 is an internal configuration diagram of an ink jet printing apparatus 1 (hereinafter, printing apparatus 1). In FIG. 1, the x-direction indicates the horizontal direction, the y-direction (direction perpendicular to the paper surface) indicates the direction in which ejection ports are arrayed in a print head 8, to be described later, and the z-direction indicates the vertical direction, respectively.

The printing apparatus 1 is an MFP (Multi Function Printer) including a print unit 2 and a scanner unit 3 and capable of performing various kinds of processing relating to the printing operation and the reading operation by the print unit 2 and the scanner unit 3 individually, or by an interlocking manner of the print unit 2 and the scanner unit 3. The scanner unit 3 includes an ADF (Auto Document Feeder) and an FBS (Flat Bed Scanner) and is capable of reading of a document automatically fed by the ADF and reading (scanning) of a document placed on a document table of the FBS by a user. Here, the MFP having both the print unit 2 and the scanner unit 3 is shown, but the MFP may be an aspect in which the scanner unit 3 is not included. FIG. 1 shows the case where the printing apparatus 1 is in a standby state where the printing apparatus 1 is performing neither the printing operation nor the reading operation.

In the print unit 2, at the bottom in the vertically downward direction of a body 4, a first cassette 5A and a second cassette 5B for storing a printing medium (cut sheet) S are installed in an attachable and detachable manner. In the first cassette 5A, comparatively small printing media up to the A4 size, and in the second cassette 5B, comparatively large printing media up to the A3 size are stored in a piled-up manner. In the vicinity of the first cassette 5A, a first feed unit 6A for feeding stored printing media by separating one by one is provided. Similarly, in the vicinity of the second cassette 5B, a second feed unit 6B is provided. In the case where the printing operation is performed, the printing medium S is selectively fed from one of the cassettes.

A conveyance roller 7, a discharge roller 12, a pinch roller 7a, a spur 7b, a guide 18, an inner guide 19, and a flapper 11 are conveyance mechanisms for guiding the printing medium S in a predetermined direction. The conveyance roller 7 is arranged on the upstream side and on the downstream side of the print head 8 and is a drive roller that is driven by a conveyance motor, not shown schematically. The pinch roller 7a is a follower roller that nips and rotates the printing medium S together with the conveyance roller 7. The discharge roller 12 is arranged on the downstream side of the conveyance roller 7 and is a drive roller that is driven by a conveyance roller, not shown schematically. The spur 7b sandwiches and conveys the printing medium S together with the conveyance roller 7 arranged on the downstream side of the print head 8 and the discharge roller 12.

The guide 18 is provided in the conveyance path of the printing medium S and guides the printing medium S in a predetermined direction. The inner guide 19 is a member extending in the y-direction and has a curved side surface, and guides the printing medium S along the side surface. The flapper 11 is a member for switching directions in which the printing medium S is conveyed at the time of the both-side printing operation. A discharge tray 13 is a tray for loading and holding the printing medium S for which the printing operation has been completed and which is discharged by the discharge roller 12.

The print head 8 is a color ink jet print head of full line type and in which a plurality of ejection ports from which ink is ejected in accordance with print data is arrayed along the y-direction in FIG. 1 so as to correspond to the width of the printing medium S. In the case where the print head 8 is at the standby position, an ejection port surface 8a of the print head 8 faces in the vertically downward direction and is capped by a cap unit 10 as shown in FIG. 1. In the case where the printing operation is performed, by a print controller 202, to be described later, the direction of the print head 8 is changed so that the ejection port surface 8a faces a platen 9. The platen 9 is made up of a flat plate extending in the y-direction and supports the printing medium S from the rear side, for which the printing operation is performed by the print head 8. The movement of the print head 8 from the standby position to the printing position will be described later in detail.

An ink tank unit 14 stores four color inks to be supplied to the print head 8, respectively. The four color inks here refer to inks of cyan (C), magenta (M), yellow (Y), and black (K). An ink supply unit 15 is provided on the way in the flow path connecting the ink tank unit 14 and the print head 8 and adjusts the pressure and the amount of flow of the ink within the print head 8 to an appropriate range. The printing apparatus 1 has a circulation-type ink supply system and the ink supply unit 15 adjusts the pressure of the ink supplied to the print head 8 and the amount of flow of the ink recovered from the print head 8 to an appropriate range.

A maintenance unit 16 includes the cap unit 10 and a wiping unit 17 and performs the maintenance operation for the print head 8 by causing these units to operate at predetermined timing. The maintenance operation will be explained later in detail.

<About Control Configuration of Printing Apparatus>

Figure 2:
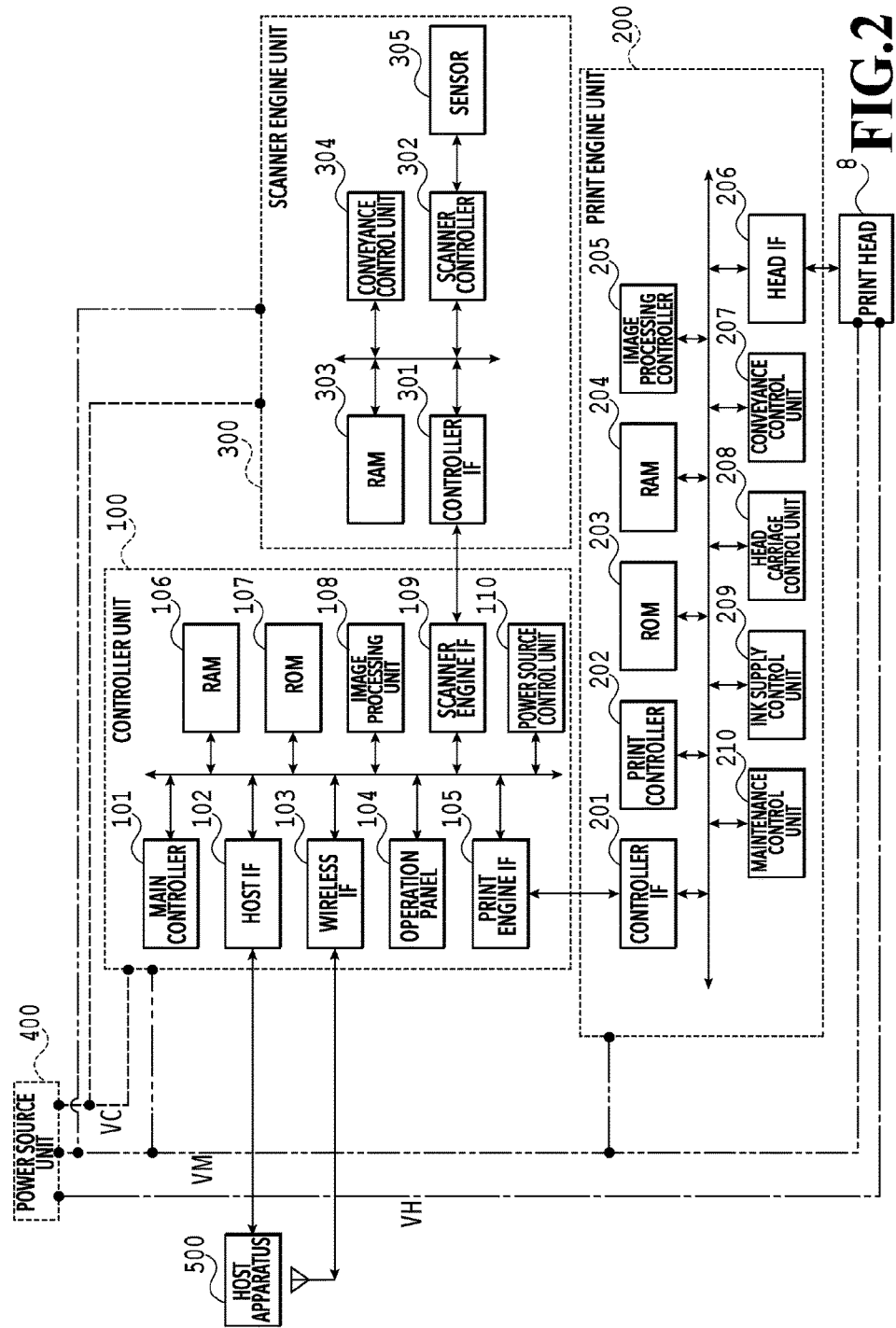
FIG. 2 is a block diagram showing a control configuration of the printing apparatus.

FIG. 2 is a block diagram showing a control configuration in the printing apparatus 1. The printing apparatus 1 mainly includes a print engine unit 200 configured to centralizedly control the print unit 2, a scanner engine unit 300 configured to centralizedly control the scanner unit 3, a power source unit 400, and a controller unit 100 configured to centralizedly control the entire printing apparatus 1. The print controller 202 controls various mechanisms of the print engine unit 200 in accordance with instructions of a main controller 101 of the controller unit 100. Various mechanisms of the scanner engine unit 300 are controlled by the main controller 101 of the controller unit 100. In the following, details of the control configuration are explained.

In the controller unit 100, the main controller 101 including a CPU controls the entire printing apparatus 1 by using a RAM 106 as a work area in accordance with programs and various parameters stored in a ROM 107. For example, in the case where a print job is input from a host apparatus 500 via a host I/F 102 or a wireless I/F 103, predetermined image processing is performed for image data received by an image processing unit 108 in accordance with instructions of the main controller 101. Then, the main controller 101 transmits the image data for which image processing has been performed to the print engine unit 200 via a print engine I/F 105.

The printing apparatus 1 may acquire image data from the host apparatus 500 via wireless communication or wired communication or may acquire image data from an external storage device (USB memory and the like) connected to the printing apparatus 1. The communication method that is made use of for wireless communication or wired communication is not limited. For example, as the communication method that is made use of for wireless communication, it is possible to apply Wi-Fi (Wireless Fidelity) (registered trademark) and Bluetooth (registered trademark). Further, as the communication method that is made use of for wired communication, it is possible to apply USB (Universal Serial Bus) and the like. Furthermore, for example, in the case where a read command is input from the host apparatus 500, the main controller 101 transmits this command to the scanner engine unit 300 via a scanner engine I/F 109.

An operation panel 104 is a mechanism for a user to input and output for the printing apparatus 1. It is possible for a user to give instructions as to the operation, such as copy and scan, to set a printing mode, to recognize information on the printing apparatus 1, and so on via the operation panel 104.

A power source control unit 110 controls a power source (power) supplied from the power source unit 400 in the controller unit 100. As will be described in FIG. 10, the power source control unit 110 mounts a timer and performs control so as to shut off the power source in accordance with completion of termination preparation of processing being performed, or completion of measurement of a predetermined count time (set time) in the timer.

The count time that is set in the timer is set in accordance with the processing being performed in the print engine unit 200, the scanner engine unit 300, and so on.

In the print engine unit 200, the print controller 202 including a CPU controls various mechanisms included in the print unit 2 by using a RAM 204 as a work area in accordance with programs and various parameters stored in a ROM 203. In the case where various commands and image data are received via a controller I/F 201, the print controller 202 temporarily stores them in the RAM 204. The print controller 202 causes an image processing controller 205 to convert the saved image data into print data so that the print head 8 can make use of for the printing operation. In the case where print data is generated, the print controller 202 causes the print head 8 to perform the printing operation based on the print data via a head I/F 206. At this time, the print controller 202 conveys the printing medium S by driving the feed units 6A and 6B, the conveyance roller 7, the discharge roller 12, and the flapper 11 shown in FIG. 1 via a conveyance control unit 207. In accordance with instructions of the print controller 202, the printing operation by the print head 8 is performed by interlocking the conveyance operation of the printing medium S and thus printing processing is performed.

A head carriage control unit 208 changes the direction and position of the print head 8 in accordance with the operating state, such as the maintenance state and the printing state, of the printing apparatus 1. An ink supply control unit 209 controls the ink supply unit 15 so that the pressure of the ink supplied to the print head 8 is adjusted within an appropriate range. A maintenance control unit 210 controls the operation of the cleaning mechanisms, such as the cap unit 10 and the wiping unit 17 in the maintenance unit 16, at the time of performing the maintenance operation for the print head 8.

In the scanner engine unit 300, the main controller 101 controls hardware resources of a scanner controller 302 by using the RAM 106 as a work area in accordance with programs and various parameters stored in the ROM 107. Due to this, various mechanisms included in the scanner unit 3 are controlled. For example, by the main controller 101 controlling the hardware resources within the scanner controller 302 via a controller I/F 301, a document mounted on the ADF by a user is conveyed via a conveyance control unit 304 and read by a sensor 305. Then, the scanner controller 302 saves the read image data in a RAM 303. It is possible for the print controller 202 to cause the print head 8 to perform the printing operation based on the image data read by the scanner controller 302 by converting the image data acquired as described above into print data.

The power source unit 400 is a unit configured to supply a power source to each unit. The power source unit 400 supplies a power source Vc (about 3.3 V) to the controller unit 100 and the scanner engine unit 300. Further, the power source unit 400 supplies a power source VM (about 30.8 V) to the controller unit 100, the print engine unit 200, the scanner engine unit 300, and the print head 8, and supplies a power source $V_H$ (about 28 V) to the print head 8.

<About Operation of Printing Apparatus in Printing State>

Figure 3:
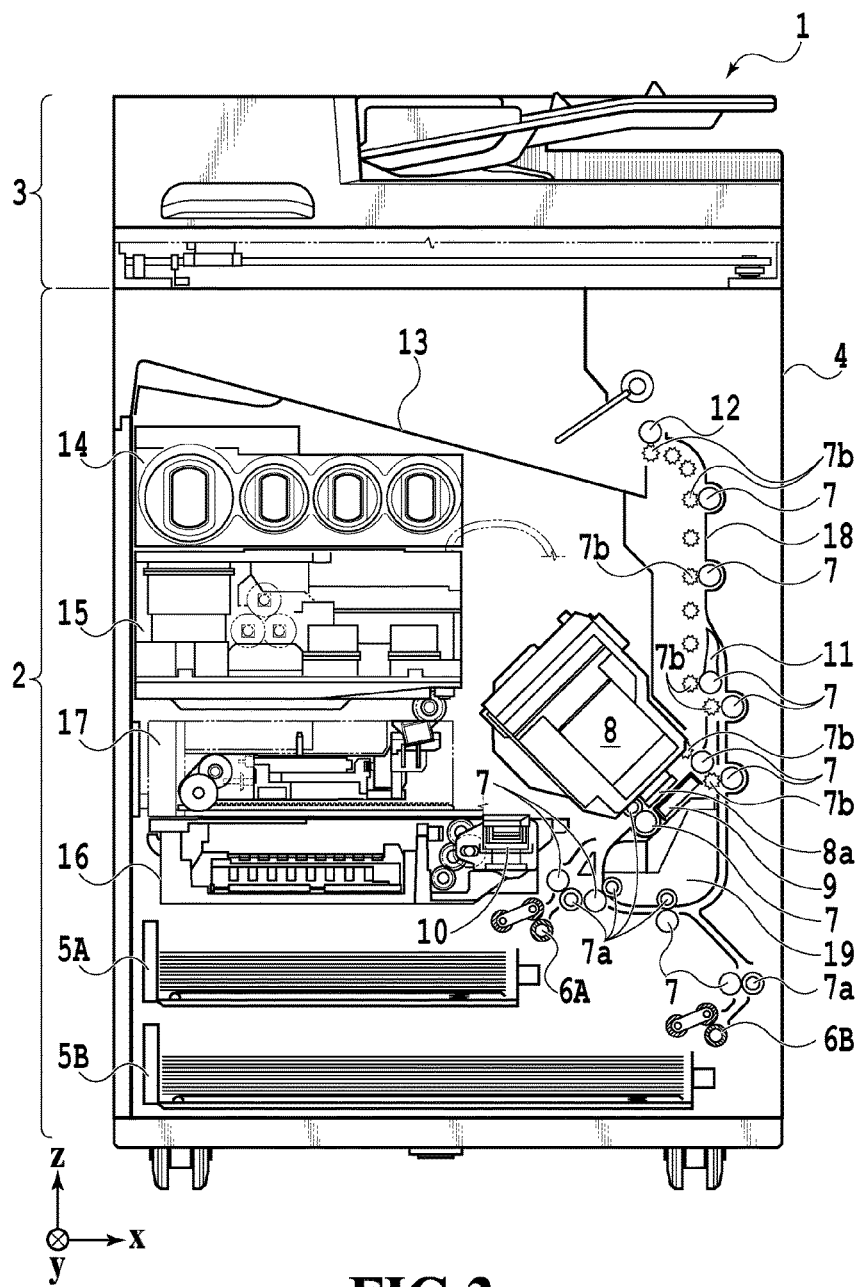
FIG. 3 is a diagram in the case where the printing apparatus is in a printing state.

FIG. 3 shows the case where the printing apparatus 1 is in the printing state. Compared to the standby state shown in FIG. 1, the cap unit 10 separates from the ejection port surface 8a of the print head 8 and the ejection port surface 8a faces the platen 9. The plane of the platen 9 is inclined about 45 degrees with respect to the horizontal direction and the ejection port surface 8a of the print head 8 at the printing position is also inclined about 45 degrees with respect to the horizontal direction so that the distance from the platen 9 is maintained at a constant value.

At the time of moving the print head 8 from the standby position shown in FIG. 1 to the printing position shown in FIG. 3, the print controller 202 lowers the cap unit 10 down to the evacuate position shown in FIG. 3 by using the maintenance control unit 210. Due to this, the ejection port surface 8a of the print head 8 separates from a cap member 10a. After this, the print controller 202 rotates the print head 8 by 45 degrees while adjusting the height in the vertical direction of the print head 8 by using the head carriage control unit 208 and causes the ejection port surface 8a to face the platen 9. In the case where the printing operation is completed and the print head 8 moves from the printing position to the standby position, the process opposite to that described above is performed by the print controller 202.

Next, the conveyance path of the printing medium S in the print unit 2 is explained. In the case where a print command is input, first, the print controller 202 moves the print head 8 to the printing position shown in FIG. 3 by using the maintenance control unit 210 and the head carriage control unit 208. After this, the print controller 202 drives one of the first feed unit 6A and the second feed unit 6B in accordance with the print command by using the conveyance control unit 207 and feeds the printing medium S.

Figure 4C:
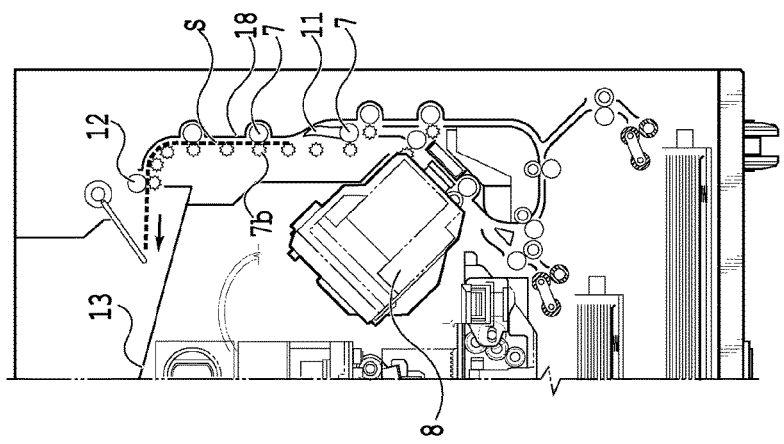
FIG. 4A to FIG. 4C are conveyance path diagrams of a printing medium fed from a first cassette.
Figure 4B:
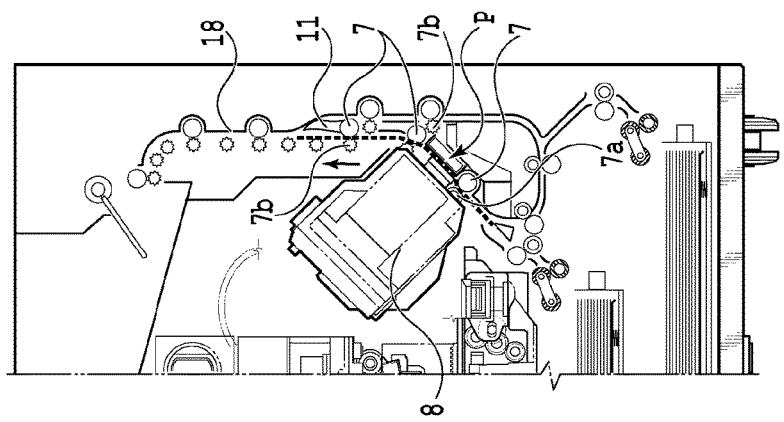
Figure 4A:
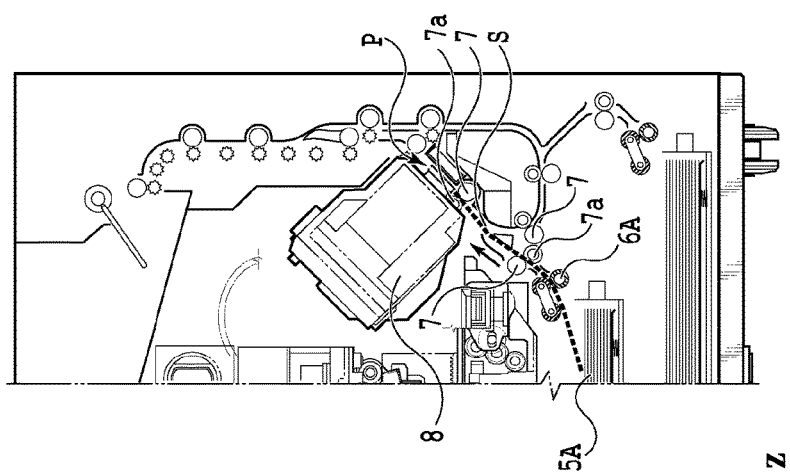

FIG. 4A to FIG. 4C are diagrams showing the conveyance path in the case where the printing medium S of the A4 size stored in the first cassette 5A is fed. The printing medium S loaded on the top within the first cassette 5A is separated from the second and subsequent printing media by the first feed unit 6A and conveyed toward a printing area P between the platen 9 and the print head 8 while being nipped by the conveyance roller 7 and the pinch roller 7a. FIG. 4A shows the conveyance state immediately before the front end of the printing medium S reaches the printing area P. The advancement direction of the printing medium S is changed from the horizontal direction (x-direction) to the direction about 45 degrees inclined with respect to the horizontal direction before the printing medium S reaches the printing area P by being fed by the first feed unit 6A.

In the printing area P, ink is ejected toward the printing medium S from a plurality of ejection ports provided in the print head 8. The printing medium S in the area where ink is given is supported by the platen 9 at its rear side and the distance between the ejection port surface 8a and the printing medium S is kept constant. The printing medium S after ink is given passes the left side of the flapper 11 whose front end is inclined to the right and is conveyed in the vertically upward direction of the printing apparatus 1 along the guide 18 while being guided by the conveyance roller 7 and the spur 7b. FIG. 4B shows the state where the front end of the printing medium S passes the printing area P and is conveyed in the vertically upward direction. The advancement direction of the printing medium S is changed from the position of the printing area P about 45 degrees inclined with respect to the horizontal direction to the vertically upward direction by the conveyance roller 7 and the spur 7b.

After being conveyed in the vertically upward direction, the printing medium S is discharged to the discharge tray 13 by the discharge roller 12 and the spur 7*b*. FIG. 4C shows the state where the front end of the printing medium S passes the discharge roller 12 and is discharged to the discharge tray 13. The discharged printing medium S is held on the discharge tray 13 in the state where the side on which an image is printed by the print head 8 faces downward.

Figure 5C:
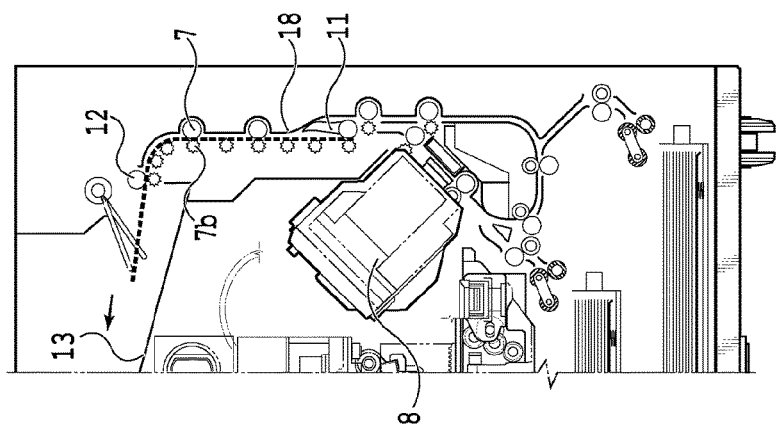
FIG. 5A to FIG. 5C are conveyance path diagrams of a printing medium fed from a second cassette.
Figure 5B:
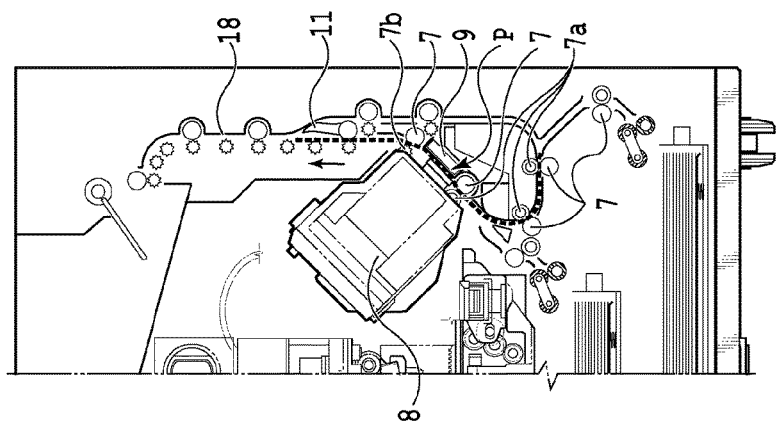
Figure 5A:
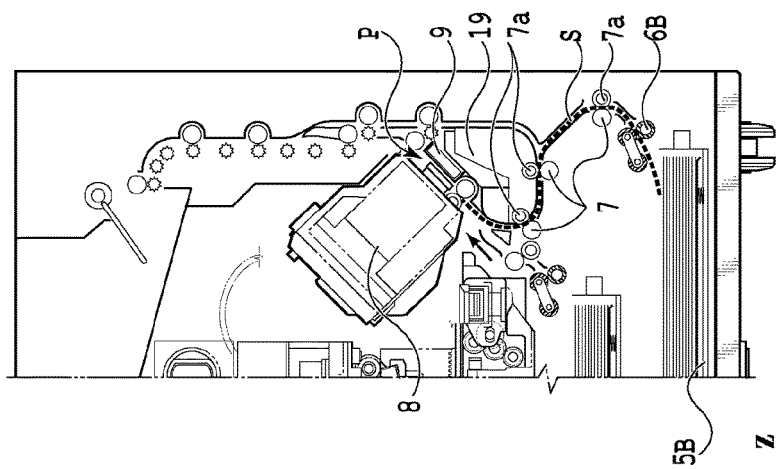

FIG. 5A to FIG. 5C are diagrams showing the conveyance path in the case where the printing medium S of the A3 size stored in the second cassette 5B is fed. The printing medium S loaded on the top within the second cassette 5B is separated from the second and subsequent printing media by the second feed unit 6B and conveyed toward the printing area P between the platen 9 and the print head 8 while being nipped by the conveyance roller 7 and the pinch roller 7*a*.

FIG. 5A shows the conveyance state immediately before the front end of the printing medium S reaches the printing area P. In the conveyance path until the printing medium S reaches the printing area P by being fed by the second feed unit 6B, a plurality of the conveyance rollers 7, a plurality of the pinch rollers 7*a*, and the inner guide 19 are arranged, and thereby, the printing medium S is curved into an S-shape and conveyed up to the platen 9.

The conveyance path after this is the same as in the case of the printing medium S of the A4 size shown in FIG. 4B and FIG. 4C. FIG. 5B shows the state where the front end of the printing medium S passes the printing area P and is conveyed in the vertically upward direction. FIG. 5C shows the state where the front end of the printing medium S passes the discharge roller 12 and is discharged to the discharge tray 13.

FIG. 6A to FIG. 6D show the conveyance path in the case where the printing operation (both-side printing) is performed on the backside (second side) of the printing medium S of the A4 size. In the case where the both-side printing is performed, after the first side (surface) is printed, the printing operation is performed on the second side (backside). The conveyance process at the time of printing the first side is the same as that in FIG. 4A to FIG. 4C, and therefore, explanation is omitted here. In the following, the conveyance process after that in FIG. 4C is explained.

After the printing operation on the first side by the print head 8 is completed and the rear end of the printing medium S passes the flapper 11, the print controller 202 conveys the printing medium S into the inside of the printing apparatus 1 by reversely rotating the conveyance roller 7. As this time, the flapper 11 is controlled so that the front end thereof inclines to the left side by an actuator, not shown schematically, and therefore, the front end (rear end in the printing operation on the first side) of the printing medium S passes the right side of the flapper 11 and is conveyed in the vertically downward direction. FIG. 6A shows the state where the front end (rear end in the printing operation on the first side) of the printing medium S passes the right side of the flapper 11.

After this, the printing medium S is conveyed along the curved outer circumferential surface of the inner guide 19 and conveyed to the printing area P between the print head 8 and the platen 9 again. At this time, the second side of the printing medium S faces the ejection port surface 8*a* of the print head 8. FIG. 6B shows the conveyance state immediately before the front end of the printing medium S reaches the printing area P for the printing operation on the second side.

The conveyance path after this is the same as in the case where the first side is printed shown in FIG. 4B and FIG. 4C.

FIG. 6C shows the state where the front end of the printing medium S passes the printing area P and is conveyed in the vertically upward direction. At this time, the flapper 11 is controlled so as to move to the position where the front end inclines to the right side by an actuator, not shown schematically. FIG. 6D shows the state where the front end of the printing medium S passes the discharge roller 12 and is discharged to the discharge tray 13.

<About Maintenance Operation for Print Head>

Next, the maintenance operation for the print head 8 is explained. As also explained in FIG. 1, the maintenance unit 16 includes the cap unit 10 and the wiping unit 17 and performs the maintenance operation by causing these units to operate at predetermined timing.

Figure 7:
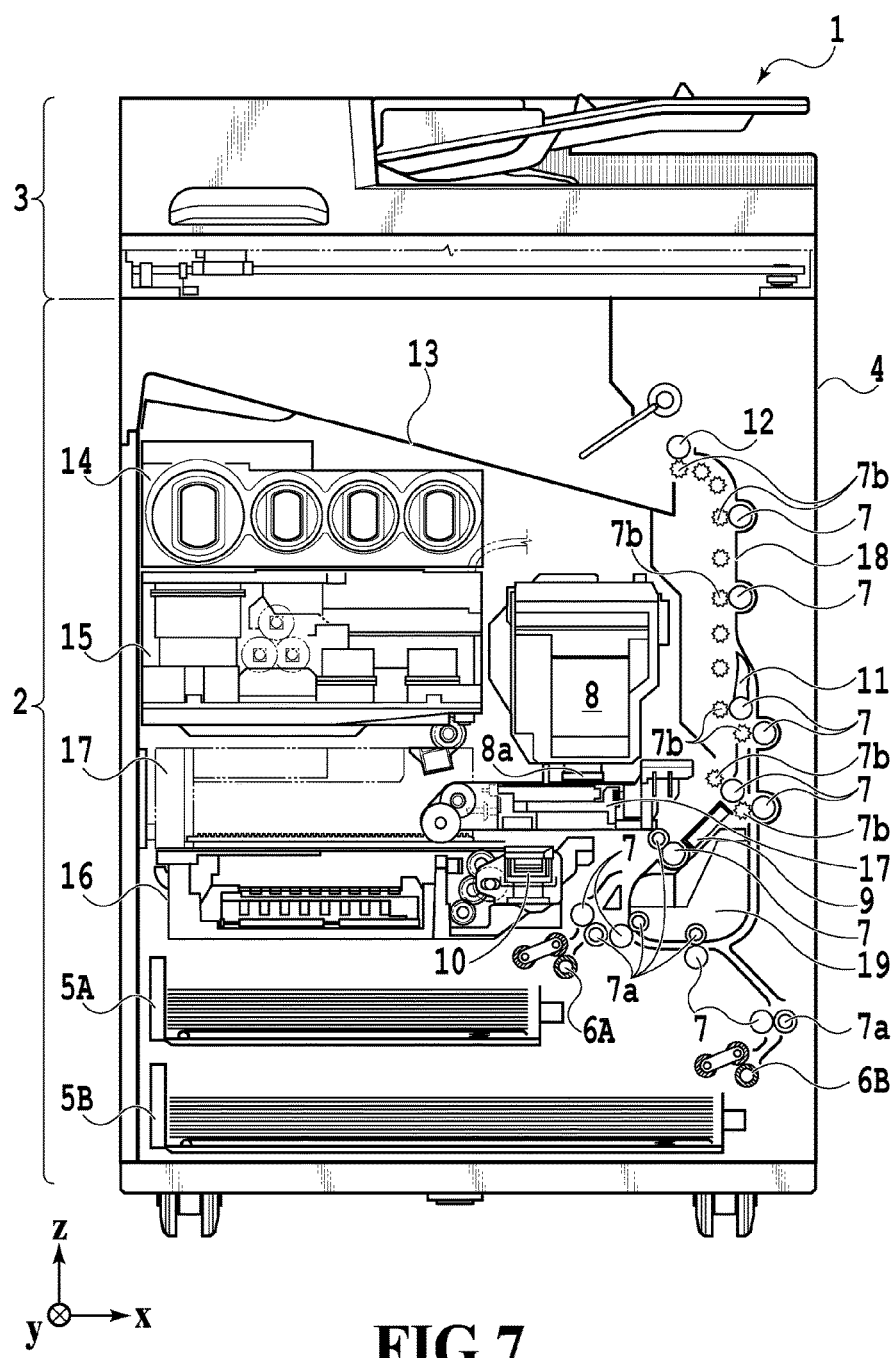
FIG. 7 is a diagram in the case where the printing apparatus is in a maintenance state.

FIG. 7 is the diagram in the case where the printing apparatus 1 is in the maintenance state. At the time of moving the print head 8 from the standby position shown in FIG. 1 to the maintenance position shown in FIG. 7, the print controller 202 moves the cap unit 10 in the vertically downward direction as well as moving the print head 8 upward in the vertical direction. Then, the print controller 202 moves the wiping unit 17 in the rightward direction in FIG. 7 from the evacuate position. After this, the print controller 202 moves the print head 8 in the vertically downward direction and moves the print head 8 to the maintenance position where the maintenance operation can be performed.

On the other hand, at the time of moving the print head 8 from the printing position shown in FIG. 3 to the maintenance position shown in FIG. 7, the print controller 202 moves the print head 8 in the vertically upward direction while rotating the print head 8 by 45 degrees. Then, the print controller 202 moves the wiping unit 17 in the rightward direction from the evacuate position. After this, the print controller 202 moves the print head 8 in the vertically downward direction and moves the print head 8 to the maintenance position where the maintenance operation by the maintenance unit 16 can be performed.

Figure 8A:
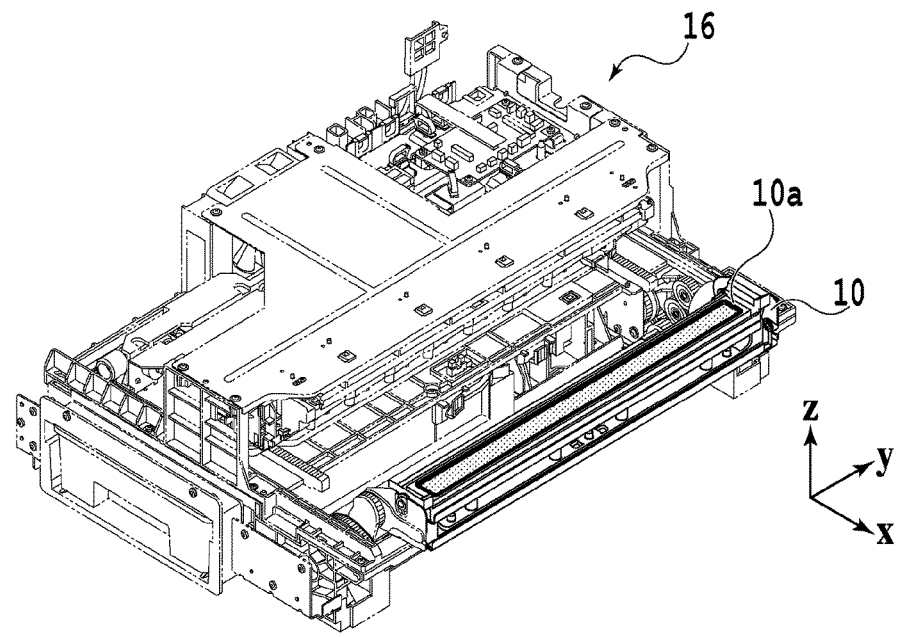
FIG. 8A and FIG. 8B are perspective diagrams each showing a configuration of a maintenance unit.
Figure 8B:
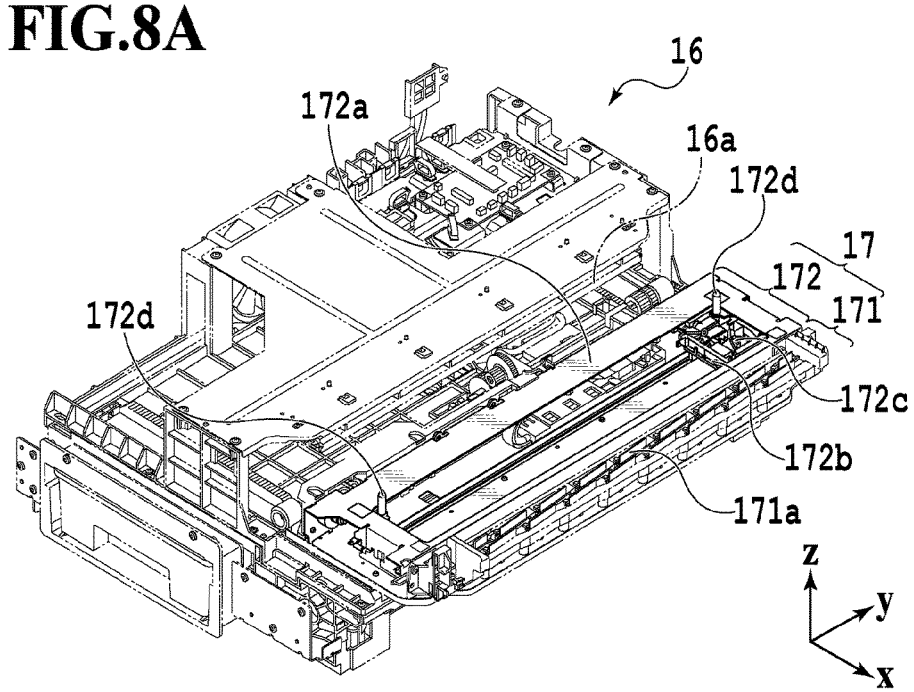

FIG. 8A is a perspective diagram showing a state where the maintenance unit 16 is at the standby position and FIG. 8B is a perspective diagram showing a state where the maintenance unit 16 is at the maintenance position. FIG. 8A corresponds to FIG. 1 and FIG. 8B corresponds to FIG. 7. In the case where the print head 8 is at the standby position, the maintenance unit 16 is at the standby position shown in FIG. 8A and the cap unit 10 has moved in the vertically upward direction and the wiping unit 17 is stored inside the maintenance unit 16. The cap unit 10 has the box-shaped cap member 10*a* extending in the y-direction and by causing the cap member 10*a* to adhere closely to the ejection port surface 8*a* of the print head 8, it is possible to suppress evaporation of ink from the ejection port. Further, the cap unit 10 also includes a function to recover ink ejected by preparatory ejection (hereinafter, abbreviated to pre-ejection) and the like to the cap member 10*a* and to cause a suction pump, not shown schematically, to suck the recovered ink (cap suction).

On the other hand, at the maintenance position shown in FIG. 8B, the cap unit 10 has moved in the vertically downward direction and the wiping unit 17 is pulled out from the maintenance unit 16. The wiping unit 17 includes two wiper units: a blade wiper unit 171 and a vacuum wiper unit 172.

In the blade wiper unit 171, the number of blade wipers 171*a* for wiping the ejection port surface 8*a* along the x-direction are arranged in the y-direction so as to cover a length corresponding to an array area of the ejection port. At the time of performing the wiping operation by using the blade wiper unit 171, the wiping unit 17 moves the blade wiper unit 171 in the x-direction in the state of being positioned at a height where the print head 8 is capable of coming into contact with the blade wiper 171a. By this movement, the ink or the like attached to the ejection port surface 8a is wiped off by the blade wiper 171a.

At the entrance of the maintenance unit 16 at the time of the blade wiper 171a being stored, a wet wiper cleaner 16a for giving a wet liquid to the blade wiper 171a as well as removing ink attached to the blade wiper 171a is arranged. Each time the blade wiper 171a is stored in the maintenance unit 16, the attached matter is removed by the wet wiper cleaner 16a and a wet liquid is applied. Then, at the time of wiping the ejection port surface 8a next, the wet liquid is transferred to the ejection port surface 8a and thereby smoothness between the ejection port surface 8a and the blade wiper 171a is improved.

On the other hand, the vacuum wiper unit 172 has a flat plate 172a having an opening extending in the y-direction, a carriage 172b capable of moving within the opening in the y-direction, and a vacuum wiper 172c mounted on the carriage 172b. The vacuum wiper 172c is arranged so as to be capable of wiping the ejection port surface 8a in the y-direction accompanying the movement of the carriage 172b. At the front end of the vacuum wiper 172c, a suction port connected to a suction pump, not shown schematically, is formed. Because of this, in the case where the carriage 172b is moved in the y-direction while causing the suction pump to operate, the ink or the like attached to the ejection port surface 8a of the print head 8 is sucked into the suction port while being wiped and collected by the vacuum wiper 172c. At this time, a positioning pin 172d provided at both ends of the flat plate 172a and the opening is made use of for positioning the ejection port surface 8a with respect to the vacuum wiper 172c.

The wiping unit 17 performs first wiping processing (blade wiping) to perform the wiping operation by the blade wiper unit 171 but not to perform the wiping operation by the vacuum wiper unit 172. Further, following the wiping operation by the blade wiper unit 171, the wiping unit 17 performs second wiping processing (vacuum wiping) to perform the wiping operation by the vacuum wiper unit 172. At the time of performing the first wiping processing, the print controller 202 first pulls out the wiping unit 17 from the maintenance unit 16 in the state where the print head 8 is evacuated in the vertically upward direction from the maintenance position in FIG. 7. Then, the print controller 202 moves the wiping unit 17 into the maintenance unit 16 after moving the print head 8 in the vertically downward direction down to the position at which the print head 8 is capable of coming into contact with the blade wiper 171a. By this movement, the ink or the like attached to the ejection port surface 8a is wiped off by the blade wiper 171a. That is, the blade wiper 171a wipes the ejection port surface 8a at the time of moving from the position where the blade wiper 171a is pulled out from the maintenance unit 16 into the maintenance unit 16.

After the blade wiper unit 171 is stored, next, the print controller 202 moves the cap unit 10 in the vertically upward direction and causes the cap member 10a to adhere closely to the ejection port surface 8a of the print head 8. Then, the print controller 202 drives the print head 8 in this state and causes the print head 8 to perform pre-ejection and sucks the ink recovered within the cap member 10a by the suction pump.

On the other hand, at the time of performing the second wiping processing, first, the print controller 202 pulls out the wiping unit 17 from the maintenance unit 16 by sliding the wiping unit 17 in the state where the print head 8 is evacuated in the vertically upward direction from the maintenance position in FIG. 7. Then, the print controller 202 moves the wiping unit 17 into the maintenance unit 16 after moving the print head 8 in the vertically downward direction down to the position where the print head 8 is capable of coming into contact with the blade wiper 171a. Due to this, the wiping operation by the blade wiper 171a is performed for the ejection port surface 8a. Next, the print controller 202 pulls out the wiping unit 17 from the maintenance unit 16 by sliding the wiping unit 17 up to a predetermined position in the state where the print head 8 is evacuated in the vertically upward direction from the maintenance position in FIG. 7 again. Following the above, the print controller 202 performs positioning of the ejection port surface 8a and the vacuum wiper unit 172 by using the flat plate 172a and the positioning pin 172d while lowering the print head 8 down to the wiping position shown in FIG. 7. After this, the print controller 202 performs the wiping operation by the vacuum wiper unit 172 described above. After evacuating the print head 8 in the vertically upward direction and storing the wiping unit 17, the print controller 202 performs pre-ejection into the cap member by the cap unit 10 and the suction operation of recovered ink as in the first wiping processing.

<About Ink Supply Unit>

Figure 9:
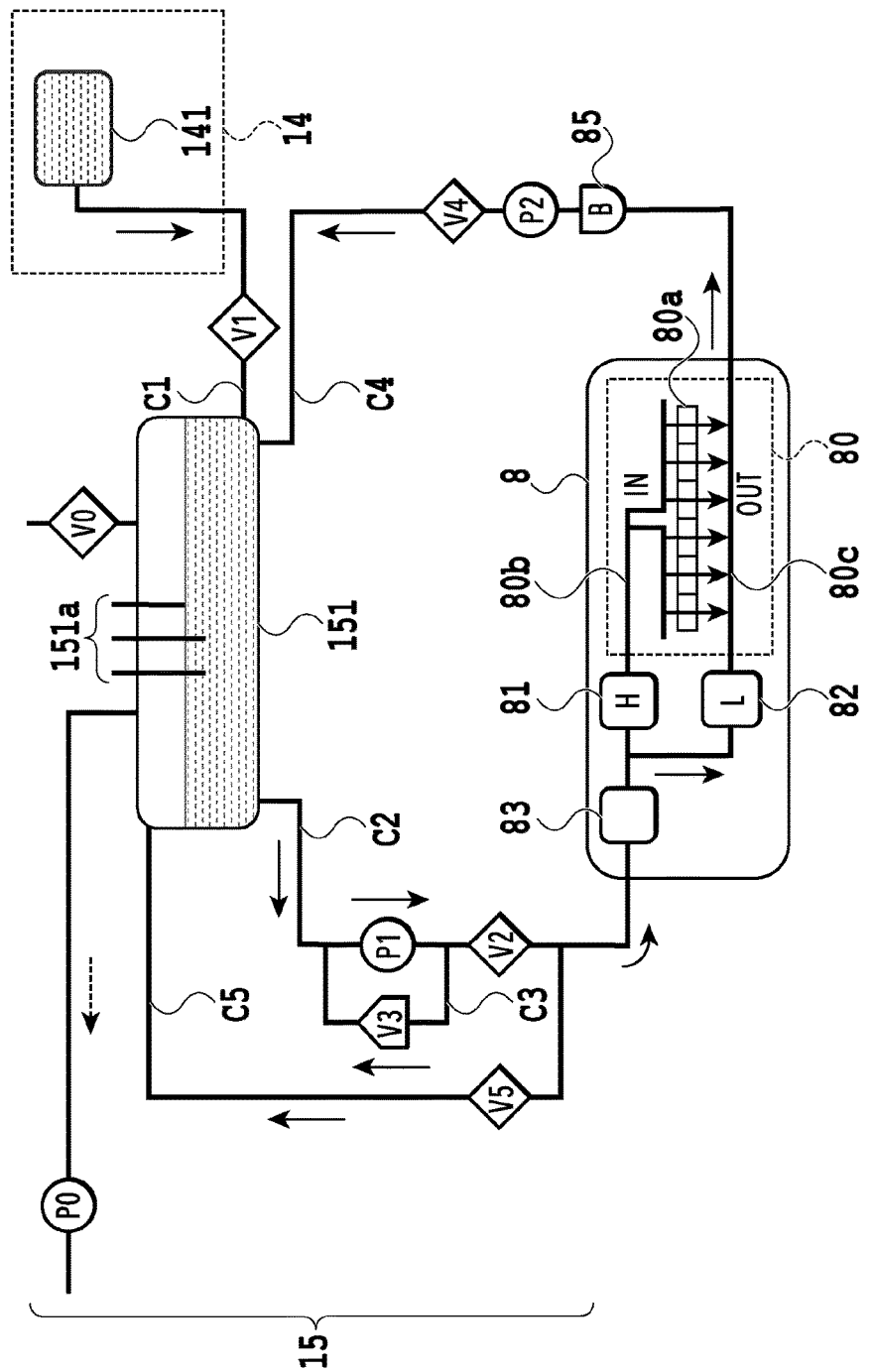
FIG. 9 is a diagram showing an ink supply unit.

FIG. 9 is a diagram showing an ink supply system including the ink supply unit 15 adopted in the printing apparatus 1 of the present embodiment. By using FIG. 9, a flow path configuration of an ink circulation system of the present embodiment is explained. The ink supply unit 15 has a configuration in which ink is supplied from the ink tank unit 14 to the print head 8. Here, the configuration of one color ink is shown, but in fact, such a configuration is prepared for each ink color. The ink supply unit 15 is controlled basically by the ink supply control unit 209 shown in FIG. 2. In the following, each configuration of the units is explained.

Ink circulates mainly between a sub tank 151 and the print head 8 (head unit in FIG. 9). In the head unit 8, the ejection operation of ink is performed based on image data and the ink not ejected is recovered again to the sub tank 151.

The sub tank 151 that stores a predetermined amount of ink is connected to a supply flow path C2 for supplying ink to the head unit 8 and a recovery flow path C4 for recovering ink from the head unit 8. That is, the circulation path through which ink circulates is made up of the sub tank 151, the supply flow path C2, the head unit 8, and the recovery flow path C4.

In the sub tank 151, a liquid surface detection unit 151a including a plurality of pins is provided and it is possible for the ink supply control unit 209 to grasp the height of the ink liquid surface, that is, the ink remaining amount within the sub tank 151 by detecting whether or not there is a conduction current between the plurality of pins. A decompression pump P0 is a negative pressure generation source for decompressing the inside of the sub tank 151. An atmosphere open valve V0 is a valve for switching whether or not to cause the inside of the sub tank 151 to communicate with the atmosphere.

A main tank 141 is a tank storing ink that is supplied to the sub tank 151. The main tank 141 is made up of a flexible member and the sub tank 151 is filled with ink by a change in volume of the flexible member. The main tank 141 has a configuration attachable to and detachable from the printing apparatus main body. On the way of a tank connection flow path C1 that connects the sub tank 151 and the main tank 141, a tank supply valve V1 for switching connections of the sub tank 151 and the main tank 141 is arranged.

With the above configuration, in the case of detecting that the amount of ink within the sub tank 151 becomes smaller than a predetermined amount by the liquid surface detection unit 151a, the ink supply control unit 209 closes the atmosphere open valve V0, a supply valve V2, a recovery valve V4, and a head exchange valve V5 and opens the tank supply valve V1. In this state, the ink supply control unit 209 causes the decompression pump P0 to operate. Then, the pressure inside the sub tank 151 becomes negative and ink is supplied from the main tank 141 to the sub tank 151. In the case of detecting that the amount of ink within the sub tank 151 exceeds a predetermined amount by the liquid surface detection unit 151a, the ink supply control unit 209 closes the tank supply valve V1 and stops the decompression pump P0.

The supply flow path C2 is a flow path for supplying ink from the sub tank 151 to the head unit 8 and on the way thereof, a supply pump P1 and the supply valve V2 are arranged. During the printing operation, by driving the supply pump P1 in the state where the supply valve V2 is open, it is possible to circulate ink in the circulation path while supplying ink to the head unit 8. The amount of ink consumed per unit time by the head unit 8 fluctuates in accordance with image data. The amount of flow of the supply pump P1 is determined so as to be compatible also with the case where the head unit 8 performs the ejection operation that maximizes the amount of ink consumption per unit time.

A relief flow path C3 is a flow path that is located on the upstream side of the supply valve V2 and which connects the upstream side and the downstream side of the supply pump P1. On the way of the relief flow path C3, a relief valve V3, which is a differential pressure valve, is arranged. In the case where the ink supply amount per unit time from the supply pump P1 is larger than the total value of the ejection amount per unit time of the head unit 8 and the flow amount (amount of ink to be drawn) per unit time in the recovery pump P2, the relief valve V3 is opened in accordance with the pressure that is exerted on the relief valve V3 itself. Due to this, a circulation path made up of a part of the supply flow path C2 and the relief flow path C3 is formed. By providing the configuration of the above-described relief flow path C3, the ink supply amount for the head unit 8 is adjusted in accordance with the amount of ink consumption in the head unit 8, and therefore, it is possible to stabilize the flow pressure within the circulation path irrespective of image data.

The recovery flow path C4 is a flow path for recovering ink from the head unit 8 to the sub tank 151 and on the way thereof, a recovery pump P2 and the recovery valve V4 are arranged. At the time of circulating ink within the circulation path, the recovery pump P2 functions as a negative pressure generation source to suck ink from the head unit 8. By the drive of the recovery pump P2, an appropriate pressure difference arises between an IN flow path 80b and an OUT flow path 80c within the head unit 8, and therefore, it is possible to circulate ink between the IN flow path 80b and the OUT flow path 80c. The flow path configuration within the head unit 8 will be described later in detail.

The recovery valve V4 is a valve for checking a backflow in the case where the printing operation is not being performed, that is, ink is not being circulated within the circulation path. In the circulation path of the present embodiment, the sub tank 151 is arranged above the head unit 8 in the vertical direction (see FIG. 1). Because of this, in the case where the supply pump P1 and the recovery pump P2 are not being driven, there is a concern that ink flows backward from the sub tank 151 to the head unit 8 due to a water head difference between the sub tank 151 and the head unit 8. In order to check such a backflow, in the present embodiment, the recovery valve V4 is provided in the recovery flow path C4.

Similarly, the supply valve V2 and the head exchange valve V5 also function as a valve for checking a backflow of ink from the sub tank 151 to the head unit 8 in the case where the printing operation is not being performed, that is, ink is not being circulated within the circulation path.

A head exchange flow path C5 is a flow path that connects the supply flow path C2 and an air layer (portion where ink is not stored) of the sub tank 151 and on the way thereof, the head exchange valve V5 is arranged. One end of the head exchange flow path C5 is connected to the upstream of the head unit 8 in the supply flow path C2 and the other end is connected to the upper portion of the sub tank 151 and communicates with the air layer inside thereof. The head exchange flow path C5 is made use of for recovering ink from the head unit 8 in use at the time of exchanging the head unit 8 or transporting the printing apparatus 1. The head exchange valve V5 is controlled by the ink supply control unit 209 so as to close except for the case where the printing apparatus 1 is initially filled with ink and the case where ink is recovered from the head unit 8. Further, the above-described supply valve V2 is provided between the connection portion with the head exchange flow path C5 and the connection portion with the relief flow path C3 in the supply flow path C2.

Next, the flow path configuration within the head unit 8 is explained. The ink supplied to the head unit 8 by the supply flow path C2 is supplied to a first negative pressure control unit 81 and a second negative pressure control unit 82 after passing a filter 83. In the first negative pressure control unit 81, the control pressure is set to a weak negative pressure. In the second negative pressure control unit 82, the control pressure is set to a strong negative pressure. The pressures in the first negative pressure control unit 81 and the second negative pressure control unit 82 are generated in an appropriate range by the drive of the recovery pump P2.

In an ink ejection unit 80, a plurality of printing element substrates 80a on which a plurality of ejection ports is arrayed is arranged and a long ejection port row is formed. The common supply flow path 80b (IN flow path) for guiding ink supplied by the first negative pressure control unit 81 and the common recovery flow path 80c (OUT flow path) for guiding ink supplied by the second negative pressure control unit 82 are also extending in the array direction of the printing element substrate 80a. Further, on the individual printing element substrates 80a, an individual supply flow path connected with the common supply flow path 80b and an individual recovery flow path connected with the common recovery flow path 80c are formed. Because of this, on the individual printing element substrates 80a, a flow of ink is generated, which flows in from the common supply flow path 80b where the negative pressure is relatively weak and flows out to the common recovery flow path 80c where the negative pressure is relatively strong. In the path between the individual supply flow path and the individual recovery flow path, a pressure chamber that communicates with each ejection port and which is filled with ink is provided and a flow of ink occurs also in the ejection port and the pressure chamber that is not performing printing. In the case where the ejection operation is performed on the printing element substrate 80*a*, a part of the ink that moves from the common supply flow path 80*b* to the common recovery flow path 80*c* is consumed by being ejected from the ejection port, but the ink that is not ejected moves to the recovery flow path C4 via the common recovery flow path 80*c*.

With the above configuration, in the case where the printing operation is performed, the ink supply control unit 209 closes the tank supply valve V1 and the head exchange valve V5, opens the atmosphere open valve V0, the supply valve V2, and the recovery valve V4, and drives the supply pump P1 and the recovery pump P2. Due to this, a circulation path of the sub tank 151→the supply flow path C2→the head unit 8→the recovery flow path C4→the sub tank 151 is established. In the case where the ink supply amount per unit time from the supply pump P1 is larger than the total value of the ejection amount per unit time of the head unit 8 and the flow amount per unit time in the recovery pump P2, ink flows into the relief flow path C3 from the supply flow path C2. Due to this, the flow amount of the ink that flows into the head unit 8 from the supply flow path C2 is adjusted.

In the case where the printing operation is not being performed, the ink supply control unit 209 stops the supply pump P1 and the recovery pump P2 and closes the atmosphere open valve V0, the supply valve V2, and the recovery valve V4. Due to this, the flow of ink within the head unit 8 stops and a backflow due to the water head difference between the sub tank 151 and the head unit 8 is also suppressed. Further, by closing the atmosphere open valve V0, leakage of ink and evaporation of ink from the sub tank 151 are suppressed.

In the case of recovering ink from the head unit 8, the ink supply control unit 209 closes the tank supply valve V1, the supply valve V2, and the recovery valve 4, opens the atmosphere open valve V0 and the head exchange valve V5, and drives the decompression pump P0. Due to this, the inside of the sub tank 151 enters a negative pressure state and the ink within the head unit 8 is recovered to the sub tank 151 via the head exchange flow path C5. As described above, the head exchange valve V5 is a valve that is closed in the normal printing operation and at the time of standby and opened at the time of recovering ink from the head unit 8. However, the head exchange valve V5 is also opened at the time of filling the head exchange flow path C5 with ink in the case where the head unit 8 is filled initially.

In the following, with the basic configuration explained hitherto in mind, a preferred embodiment of the present invention is explained.

Figure 10:
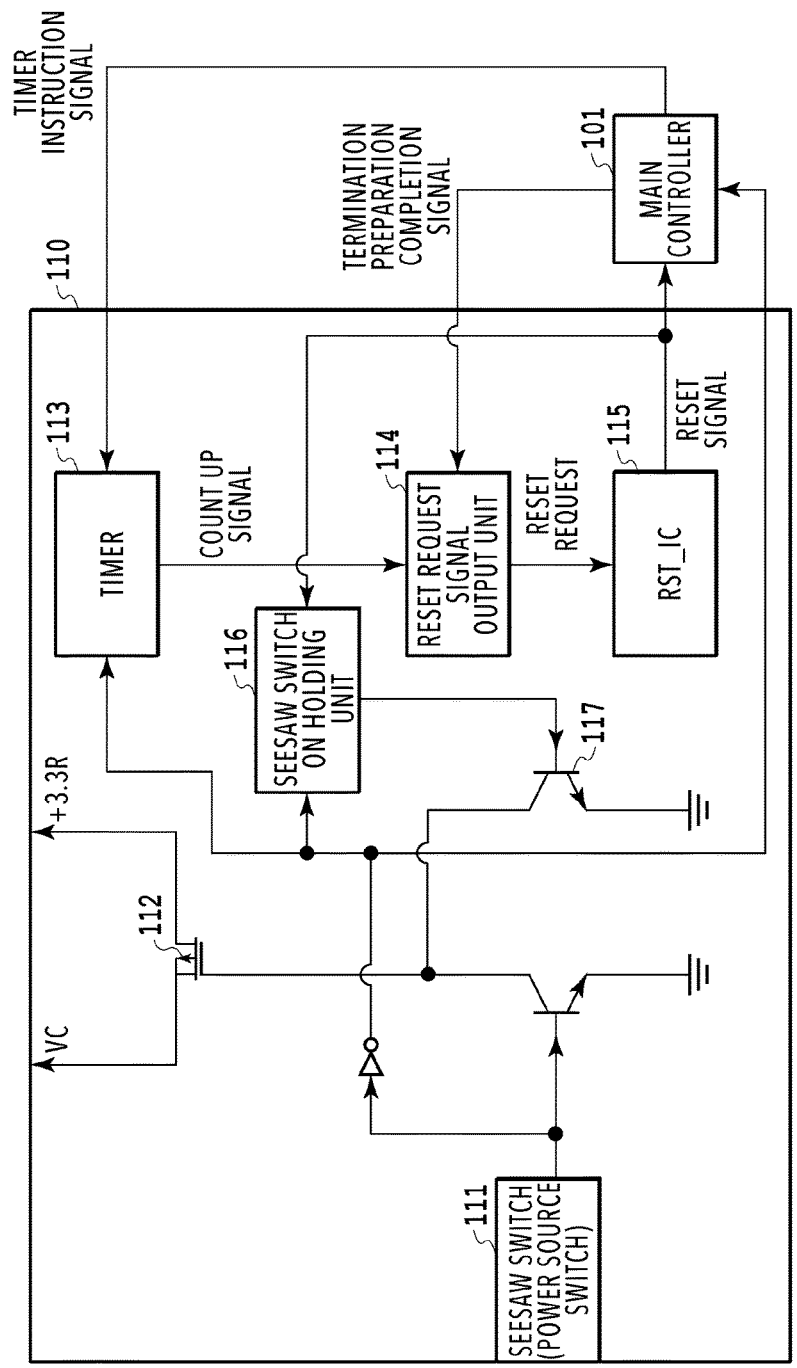
FIG. 10 is a block diagram showing a configuration of a power source control unit of a controller unit.

FIG. 10 is a block diagram showing a configuration of the power source control unit 110 of the controller unit 100. As shown in FIG. 10, the power source control unit 110 mainly includes a seesaw switch 111, an FET switch 112, a timer 113, a reset request signal output unit 114, an RST_IC 115, and a seesaw switch ON holding unit 116.

The seesaw switch 111 is a power source switch of the printing apparatus 1 and switches the printing apparatus 1 to the on-state or the off-state by the operation of a user. The FET (Field Effect Transistor) switch 112 is a switch (control circuit) for switching between supply and shutoff of the power source (Vc) converted from the commercial power source.

The timer 113 measures a count time that is set in accordance with termination preparation processing for causing processing being performed to move into a state where the power source can be turned off after the seesaw switch 111 is switched to off. That is, an approximate time predicted to be required for terminating the processing safely is measured. Consequently, in the case where the count time that is set in accordance with the termination preparation processing described above is 30 [s], the timer 113 measures 30 [s] and in the case where the set count time is 60 [s], the timer 113 measures 60 [s]. In addition, in the present embodiment, the count time is set by causing a predetermined standby time to elapse after the seesaw switch 111 is switched and for the measurement of the predetermined standby time also, the timer 113 is used (although details will be described later).

It is possible to make up the timer 113 by, for example, a plurality of units for each count time that is set and in each unit, a count time setting register, an addition circuit, an addition register, a comparison circuit, and so on are mounted. Then, in this configuration, by selecting a target unit by the value of a timer instruction signal in accordance with the termination preparation processing described above, it is possible to set and measure a count time corresponding to the termination preparation processing. That is, by selecting a count up signal that is output from a target unit and which indicates whether or not measurement is completed, it is possible to set and measure a count time corresponding to the termination preparation processing. In the case of completing measurement of the set count time, the timer 113 outputs a count up signal to the reset request signal output unit 114.

The reset request signal output unit 114 outputs a reset request signal to the RST_IC 115 in the case where the count up signal makes a transition from the High level to the Low level, or in the case where the termination preparation completion signal makes a transition from the High level to the Low level. The termination preparation completion signal is a signal indicating that the termination preparation of the processing being performed is completed and which is output from the main controller 101.

The RST_IC 115 is an IC for reset. Upon receipt of the reset request signal from the reset request signal output unit 114 as a pulse signal, the RST_IC 115 performs control so that the reset signal that is output to the main controller 101 and the seesaw switch ON holding unit 116 changes from the High level to the Low level. That is, the RST_IC 115 performs control so as to apply reset.

The seesaw switch ON holding unit 116 holds the signal in the on-state (High level) of the seesaw switch 111 even in the case where the seesaw switch 111 is switched to off and supplies the signal in the on-state to the base of a transistor 117 making up an OR circuit. Due to this, the FET switch 112 is also maintained in the on-state and the power source (Vc) is supplied.

Further, in the case where the reset signal that is output from the RST_IC 115 makes a transition from the High level to the Low level, the seesaw switch ON holding unit 116 cancels the signal in the on-state (High level) and supplies the signal to the base of the transistor making up the OR circuit. Due to this, the FET switch 112 enters the off-state and the power source (Vc) is shut off.

Figure 11A:
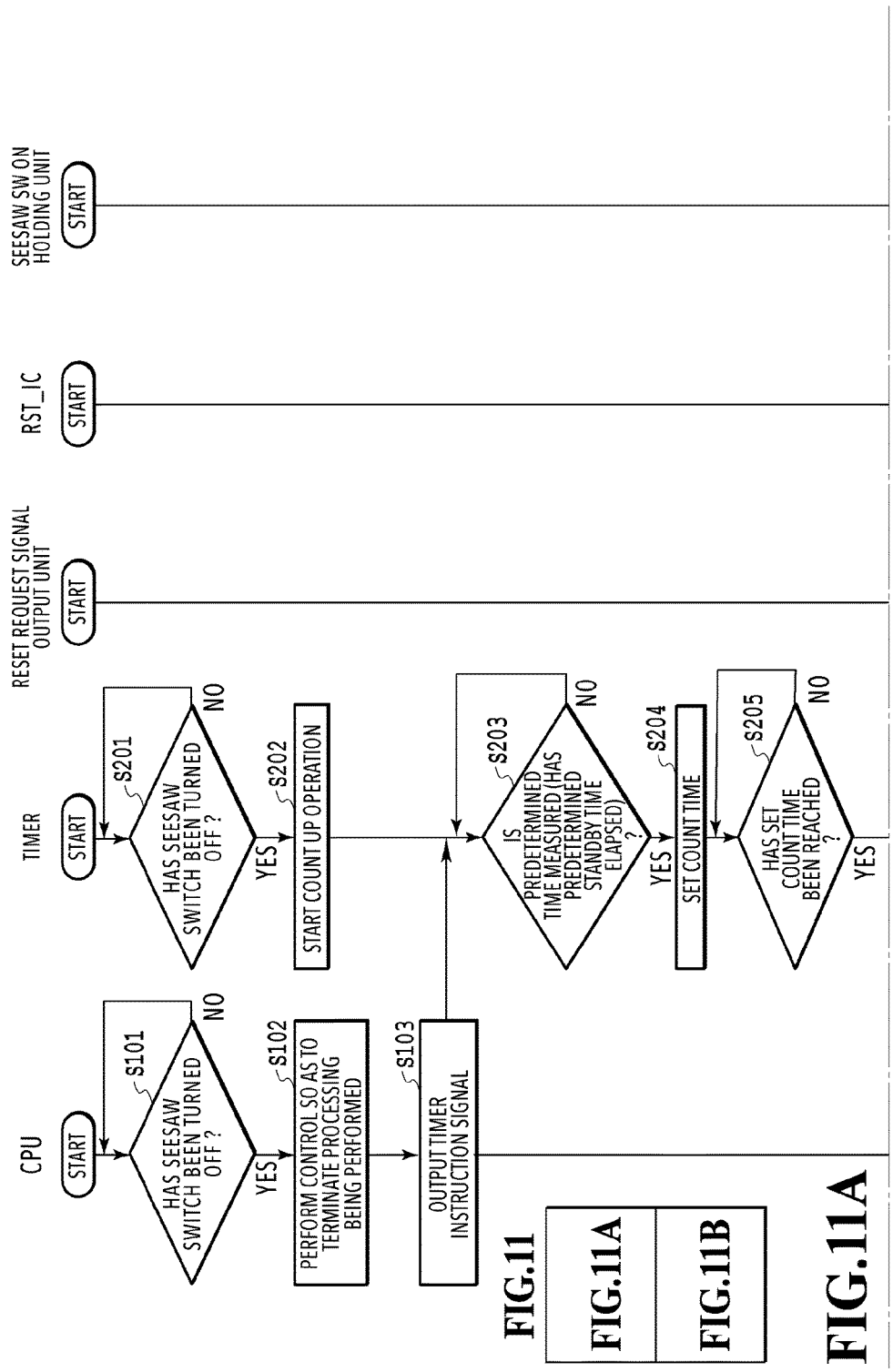
FIG. 11A is a flowchart showing a procedure of processing to shut off a power source.
Figure 11B:
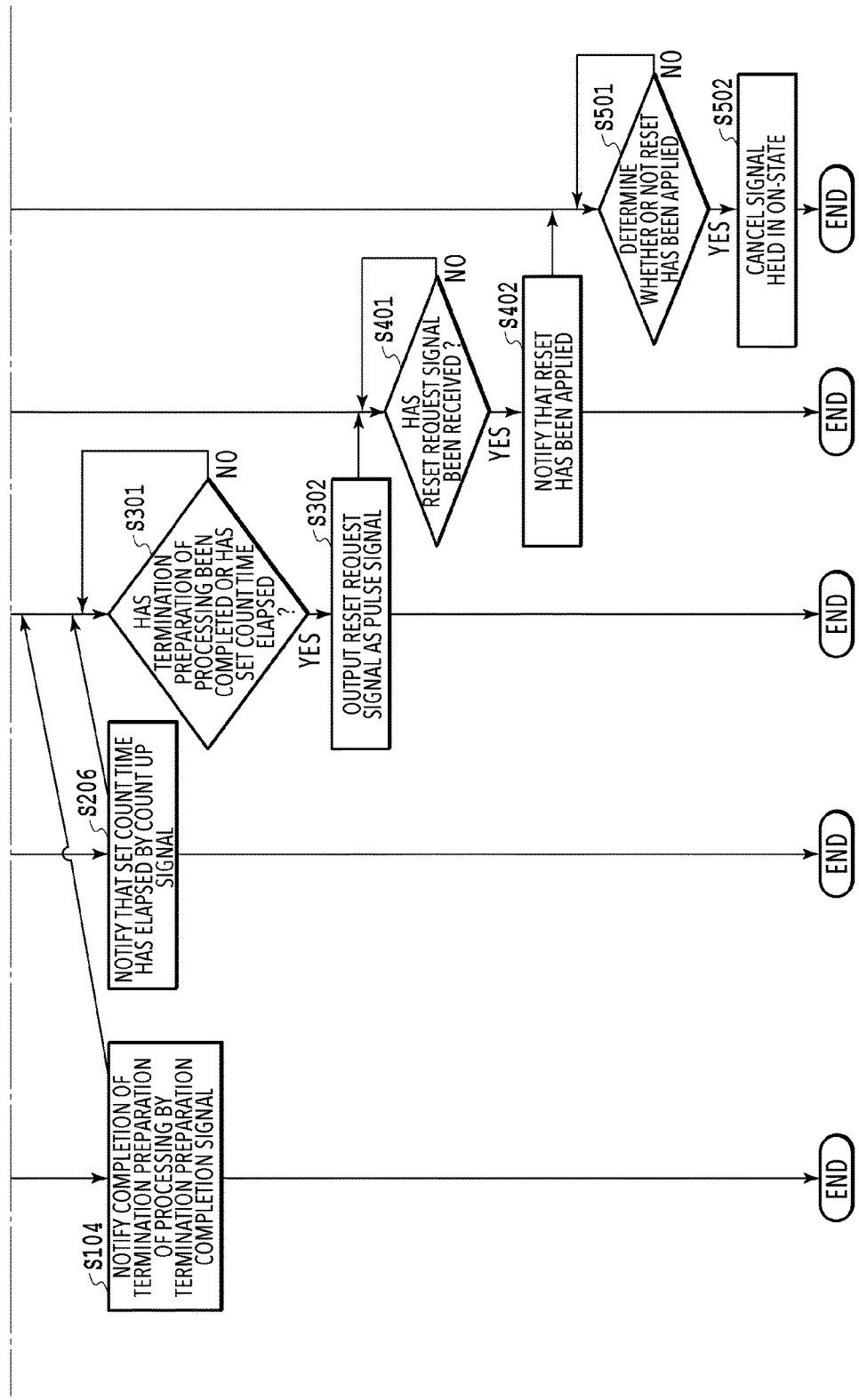
FIG. 11B is a flowchart showing a procedure of processing to shut off a power source.

Next, the procedure of processing to shut off the power source in the printing apparatus 1 is explained by using a flowchart shown in FIG. 11A and FIG. 11B. The main controller 101 determines whether or not the seesaw switch 111 has been turned off (S101). Specifically, the main controller 101 determines whether or not the signal that is supplied from the seesaw switch 111 has made a transition from the Low level to the High level. Then, in the case of determining that the seesaw switch 111 has been turned off (S101 YES), the main controller 101 specifies the processing being performed in the printing apparatus 1 and performs control so as to terminate the processing (S102). Here, as a method of performing control so as to terminate processing, there is a case where a series of processing at the normal time is performed continuously, or it may also be possible to perform reduced processing different from the series of processing at the normal time for the purpose of reducing the termination processing. Here, the reduced processing corresponds to processing in which processing on the way is omitted in the processing being performed and the last processing is performed. For example, in the first wiping processing described above, the print controller 202 first evacuates the print head 8 in the vertically upward direction from the maintenance position in FIG. 7. Then, the print controller 202 performs processing, such as pulling out the wiping unit 17 from the maintenance unit 16 and moving the print head 8 in the vertically downward direction down to the position at which the print head 8 is capable of coming into contact with the blade wiper 171a. Further, the print controller 202 performs processing to move the wiping unit 17 into the maintenance unit 16. Then, lastly, the print controller 202 moves the cap unit 10 in the vertically upward direction and causes the cap member 10a to adhere closely to the ejection port surface 8a of the print head 8. Here, in order to perform the above-described reduced processing, at S102, the main controller 101 causes the print controller 202 not to perform the series of processing but causes the print controller 202 to omit the processing on the way. Then, the main controller 101 causes the print controller 202 to perform processing to cause the cap member 10a to adhere closely to the ejection port surface 8a of the print head 8. By the above processing, it is made possible for the main controller 101 to reduce the processing at S102. In the present embodiment, the above-described reduced processing is performed by the main controller 101 giving instructions to the print controller 202, but another method may be used. For example, in the case where it is possible for the print controller 202 to recognize that the seesaw switch 111 is off, it may also be possible for the print controller 202 to omit the processing on the way by the determination of the print controller 202 itself. Further, it may also be possible to switch whether to perform the series of processing at the normal time continuously or to perform the reduced processing at S102 in accordance with the processing specified at 102. For example, in the case where "ink circulation" and "blade wiping", to be described later in FIG. 13, are specified at S102, the main controller 101 performs the series of processing at the normal time continuously. On the other hand, in the case where "vacuum wiping" and "charge suction", to be described later in FIG. 13, are specified at S102, the main controller 101 performs the reduced processing.

Further, in the case of specifying the processing being performed in the printing apparatus 1, the main controller 101 generates a timer instruction signal based on the processing and transmits the generated timer instruction signal to the timer 113 (S103). The timer instruction signal will be explained specifically by using FIG. 13, to be described later.

After this, in the case where the termination preparation of the processing being performed in the printing apparatus 1 is completed, the main controller 101 performs control so that the termination preparation completion signal changes from the High level to the Low level and outputs the termination preparation completion signal to the reset request signal output unit 114 (S104). Due to this, the reset request signal output unit 114 is notified of completion of the termination preparation of the processing being performed.

As shown in timing charts in FIG. 15 and FIG. 16, to be described later, in the case where supply of power source is shut off by the count up signal, the termination preparation completion signal makes a transition from the High level to the Low level resulting from the shutoff of supply of power source. However, in this case, the power source is no longer supplied to the controller unit 100 itself, and therefore, it is unlikely that a pulse signal (reset request signal) is output from the reset request signal output unit 114.

The timer 113 determines whether or not the seesaw switch 111 has been turned off as the main controller 101 does (S201). Then, in the case of determining that the seesaw switch 111 has been turned off (S201 Yes), the timer 113 starts the count up operation (S202).

After this, the timer 113 determines whether or not a predetermined standby time has elapsed after the seesaw switch 111 is turned off (S203). Specifically, for example, whether or not 1 [s] has elapsed after the seesaw switch 111 is turned off is determined.

In the case of determining that a predetermined standby time has elapsed after the seesaw switch 111 is turned off at step S203 (S203 Yes), the timer 113 sets a count time based on the timer instruction signal received from the main controller (S204).

Figure 12:
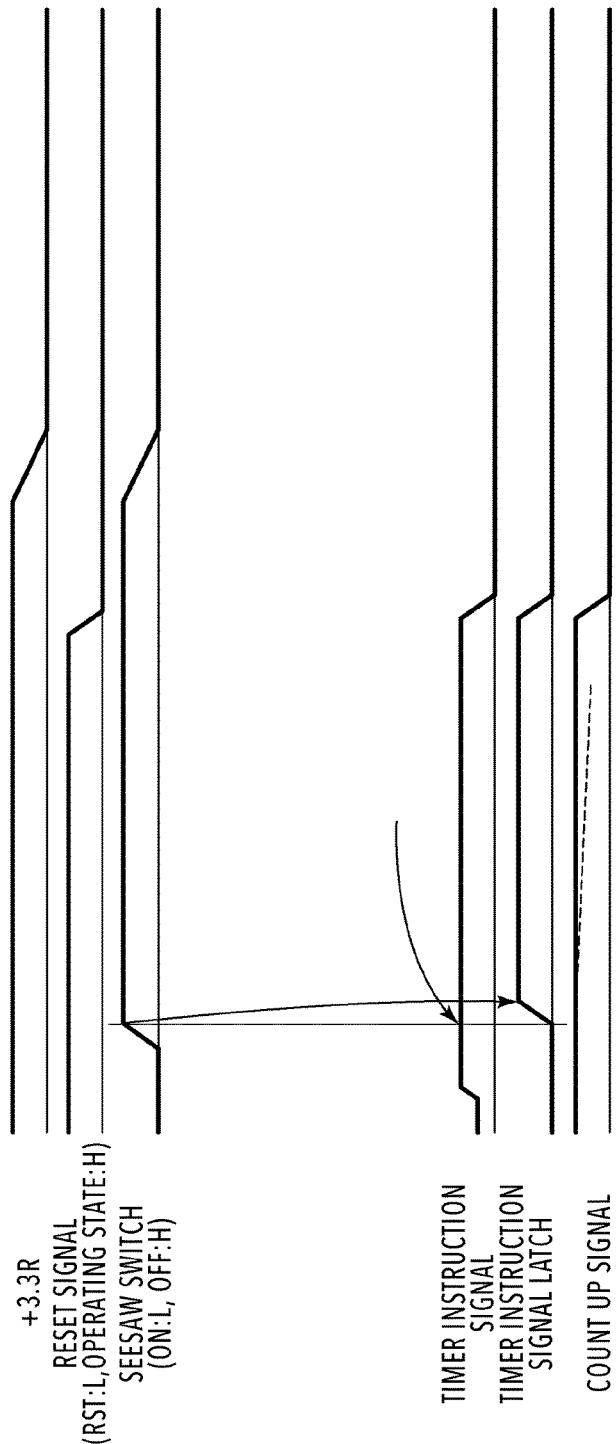
FIG. 12 is a timing chart in the case where a count time is set erroneously.

Here, explanation is supplemented for the processing at steps S203 and S204 by using a timing chart in FIG. 12. That is, explanation is supplemented for the processing to set a count time after it is determined that a predetermined standby time has elapsed after the seesaw switch 111 is turned off by using FIG. 12.

In the example shown in FIG. 12, at the point in time at which the seesaw switch 111 is turned off (that is, the point in time at which a transition is made from the Low level to the High level), the timer 113 sets a count time based on the timer instruction signal without causing a predetermined standby time to elapse.

In this case, the timer 113 latches a timer instruction signal and sets a count time in the state where the termination preparation processing is not settled, that is, in the state where the timer instruction signal is not settled. Because of this, there is a possibility that the processing that is the target of termination preparation is changed afterward, and as a result of this, there is a possibility that an erroneous count time is set.

Consequently, in the present embodiment, by performing the processing at step S203 (that is, by causing a predetermined standby time to elapse), the processing that is the target of termination preparation is settled correctly and an appropriate count time is set.

Returning to FIG. 11A again, the timer 113 determines whether or not the time counted by the count up operation started at step S202 has reached the count time set at step S204 (S205).

Then, in the case of determining that the counted time has reached the count time set at step S204, the timer 113 performs control so that the count up signal changes from the High level to the Low level and outputs the count up signal to the reset request signal output unit 114 (S206). Due to this, the reset request signal output unit 114 is notified that the set count time has elapsed.

As shown in a timing chart in FIG. 14, to be described later, in the case where supply of power source is shut off by the termination preparation completion signal, the count up signal is reset in accordance with a reset signal. That is, the count up operation is stopped and the counted time is reset.

The reset request signal output unit 114 determines whether the completion of termination preparation of the processing being performed is detected from the termination preparation completion signal transmitted from the main controller, or the elapse of the set count time is detected from the count up signal transmitted from the timer 113 (S301). In the case where the completion of termination preparation of the processing being performed, or the elapse of the set count time is detected, the reset request signal output unit 114 outputs the reset request signal to the RST_IC 115 as a pulse signal (S302).

The RST_IC 115 determines whether or not the reset request signal has been transmitted as a pulse signal from the reset request signal output unit 114 (that is, whether or not the reset request signal has been received as a pulse signal is determined) (S401). In the case of determining that the reset request signal has been received as a pulse signal, the RST_IC 115 performs control so that the reset signal changes from the High level to the Low level and outputs the reset signal to the seesaw switch ON holding unit 116 and the main controller 101 (S402). Due to this, the seesaw switch ON holding unit 116 and the main controller 101 are notified that reset has been applied.

The seesaw switch ON holding unit 116 determines whether or not the reset signal has made a transition from the High level to the Low level from the RST_IC 115 (that is, whether or not reset has been applied is determined) (S501).

Then, in the case of determining that the reset signal has made a transition from the High level to the Low level, the seesaw switch ON holding unit 116 cancels the signal supplied from the seesaw switch, which has been held at the High level (that is, the signal is controlled so as to change to the Low level) (S502). Due to this, the FET switch 112 is turned off and supply of power source to the controller unit 100 and the scanner engine unit 300 is shut off.

FIG. 13 shows processing being performed in the printing apparatus 1 and a count time that is set in accordance with the processing as an example thereof. Here, "charge suction" shown at No. 4 in FIG. 13 refers to an operation to remove air bubbles and the like having collected within the print head 8 at the same time by applying a high negative pressure to the print head 8 instantaneously in the state where the cap unit 10 is caused to adhere closely to the print head 8. Further, the count time is set with a predetermined buffer (margin) being attached based on the time required until the power source is turned off (specifically, the time required for the process and the time required for the firmware as shown in FIG. 13). Here, the time required for the process is indicated by the time taken until the series of operations relating to the processing is completed and the time required for the firmware is indicated by the time taken until the execution of the series of programs relating to the processing is completed. In addition, as a supplement, in the case where the CPU runs out of control, unless supply of power source is shut off based on the set time shown in FIG. 13, for example, there is a case or the like where an excessive burden is imposed on the drive mechanism of the print head 8 and the like.

In the case where the processing being performed is "ink circulation" and "blade wiping", 30 [s] is set as the count time as shown in FIG. 13. That is, in the case of specifying that "ink circulation" or "blade wiping" is being performed at S102, the main controller 101 outputs a timer instruction signal in which 30 [s] is set as the count time at S103. Further, in the case of specifying that "vacuum wiping" is being performed at S102, the main controller 101 outputs a timer instruction signal in which 50 [s] is set as the count time at S103. Similarly, in the case of specifying that "charge suction" is being performed at S102, the main controller 101 outputs a timer instruction signal in which 60 [s] is set as the count time at S103. Then, this count time is converted into the number of times of clock and set in the count time setting register of the timer 113 described previously.

Further, the main controller 101 outputs a timer instruction signal in accordance with the processing being performed (that is, the count time) for which termination preparation is scheduled. In this case, for example, the timer instruction signal is set in two bits and "00" is defined as "30 [s]", "01" as "50 [s]", and "10" as "60 [s]". Upon receipt of a timer instruction signal, the timer 113 outputs a count up signal based on the timer instruction signal.

In timing charts shown in FIG. 15, FIG. 16, and so on, to be described later, an example is shown in which the timer instruction signal is set in one bit, and for example, "(Low)" is defined as "30 [s]" and "1 (High)" as "60 [s]".

Figure 14:
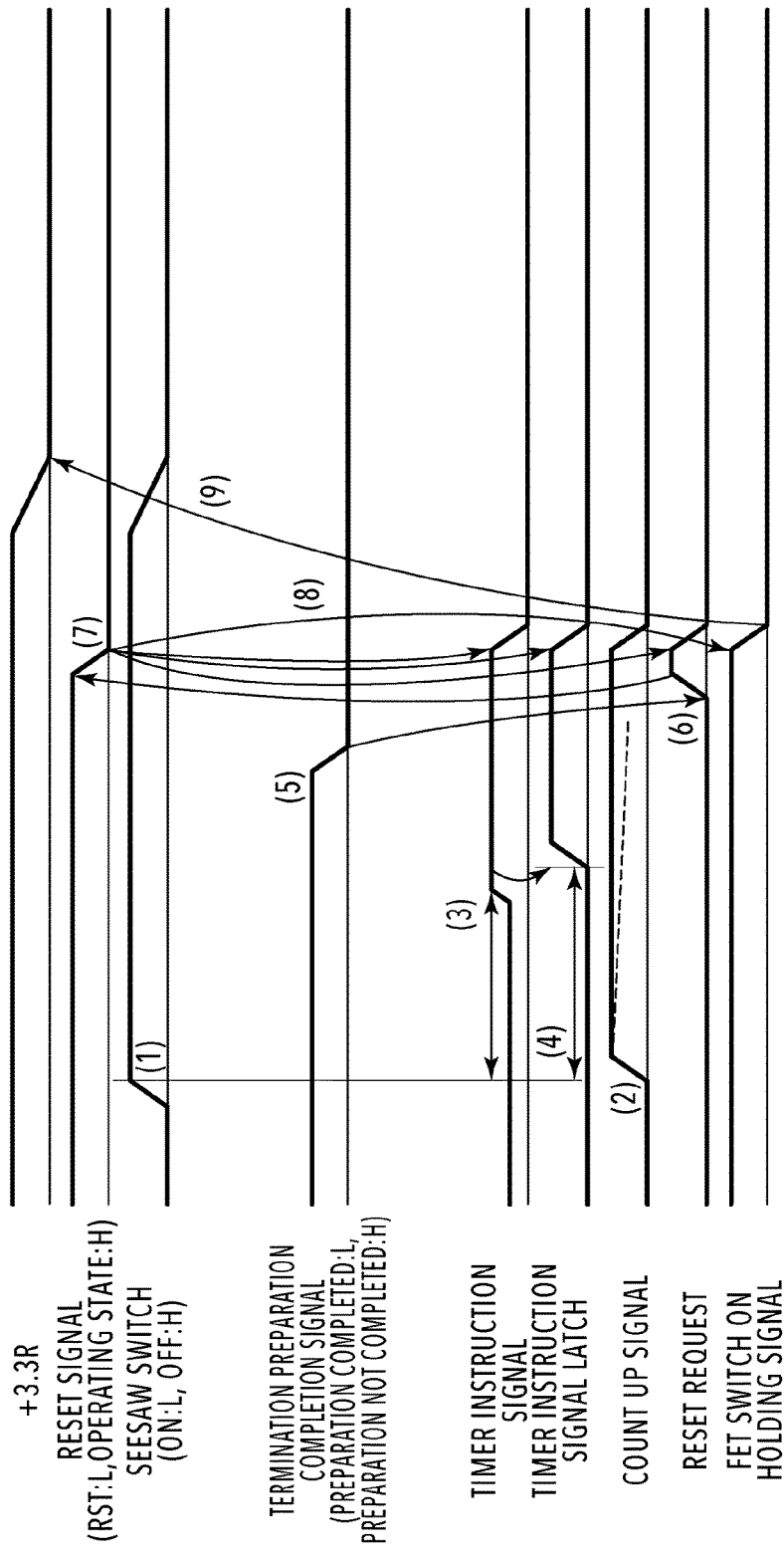
FIG. 14 is a timing chart showing an operation until supply of power source is shut off by a termination preparation completion signal.

FIG. 14 is a timing chart showing the operation until supply of power source is shut off by a termination preparation completion signal that is output from the main controller 101. In the case where the seesaw switch 111 is switched (that is, control is performed so that the Low level changes to the High level) by a user in the state where the power source is supplied to the controller unit 100 (1), the timer 113 starts the count up operation (2). That is, the count up signal is controlled so that the Low level changes to the High level. Next, the timer 113 settles the count time (4) from the timer instruction signal (3) output from the main controller 101 after a predetermined time elapses and latches (holds) the count time as a signal.

After this, in the case where the termination preparation of the processing being performed in the printing apparatus 1 is completed, the main controller 101 performs control so that the termination preparation completion signal changes from the High level to the Low level (5). That is, the main controller 101 notifies the reset request signal output unit 114 that the termination preparation of the processing being performed is completed.

In the case of detecting that the termination preparation completion signal has made a transition from the High level to the Low level, the reset request signal output unit 114 outputs a reset request signal to the RST_IC 115 as a pulse signal (6). In the case of detecting the reset request signal, the RST_IC 115 performs control so that the reset signal changes from the High level to the Low level (7). Due to this, the seesaw switch ON holding unit 116 and the main controller 101 are notified that reset has been applied.

The seesaw switch ON holding unit 116 cancels the signal supplied from the seesaw switch, which has been held in the on-state (High level) (that is, control is performed so that the level changes to the Low level) (8). Then, in the case where the signal supplied from the seesaw switch, which has been held in the on-state, is cancelled, as a result, the FET switch 112 is turned off and the power source is no longer supplied to the controller unit 100 (9).

Figure 15:
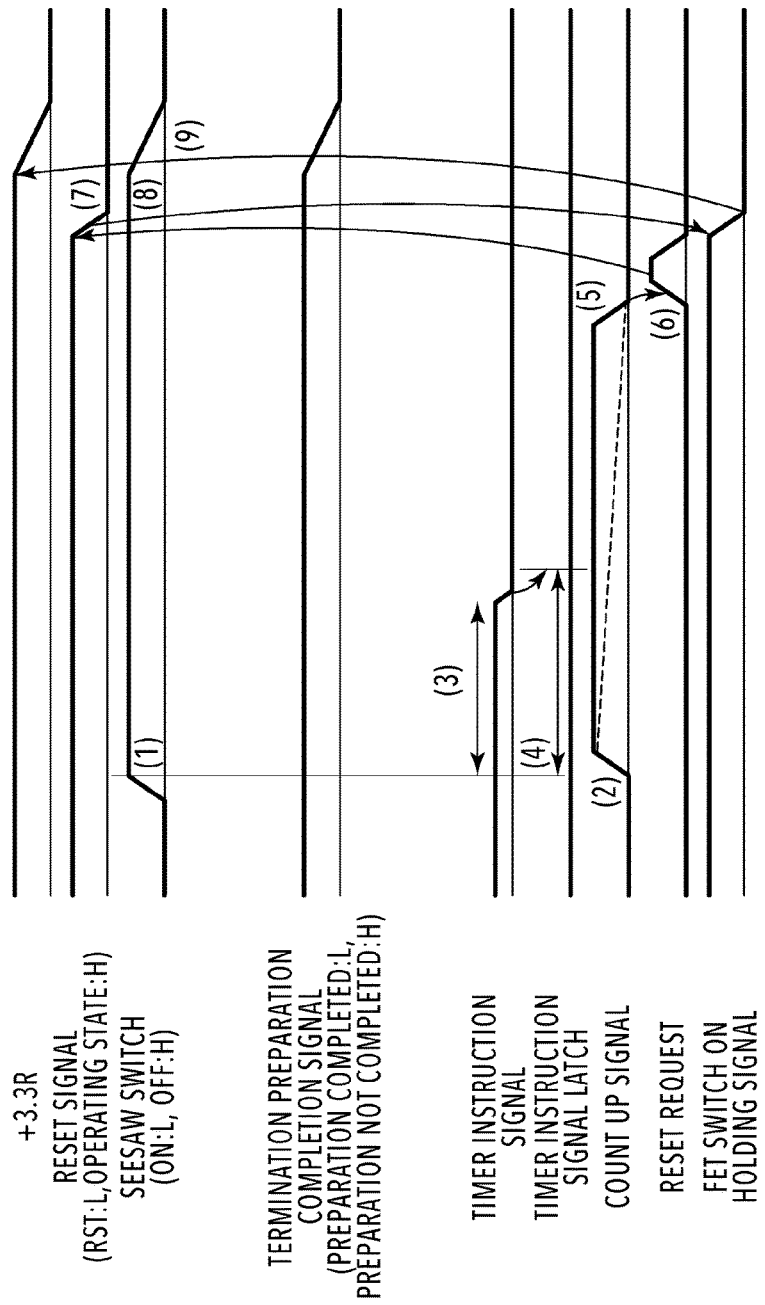
FIG. 15 is a timing chart showing an operation until supply of power source is shut off by a count up signal.

FIG. 15 is a timing chart showing the operation until supply of power source is shut off by a count up signal that is output from the timer 113. In FIG. 15, an example is shown in which 30 [s] is set as the timer time.

In the case where the seesaw switch 111 is switched (that is, control is performed so that the Low level changes to the High level) by a user in the state where the power source is supplied to the controller unit 100 (1), the timer 113 starts the count up operation (2). That is, the count up signal is controlled so that the Low level changes to the High level (2). Next, the timer 113 settles the count time (4) from the timer instruction signal (3) output from the main controller 101 after a predetermined time elapses and latches (holds) the count time as a signal (Low level).

After this, in the case where it is determined that the counted time has reached the set count time (30 [s]), the timer 113 performs control so that the count up signal changes from the High level to the Low level and outputs the count up signal to the reset request signal output unit 114 (5).

In the case of detecting that 30 [s] has elapsed and the count up signal has made a transition from the High level to the Low level, the reset request signal output unit 114 outputs a reset request signal to the RST_IC 115 as a pulse signal (6). In the case of detecting the reset request signal, the RST_IC 115 performs control so that the reset signal changes from the High level to the Low level (7). Due to this, the seesaw switch ON holding unit 116 and the main controller 101 are notified that reset has been applied.

The seesaw switch ON holding unit 116 cancels the signal supplied from the seesaw switch, which has been held in the on-state (High level) (that is, control is performed so that the level changes to the Low level) (8). Then, in the case where the signal supplied from the seesaw switch, which has been held in the on-state, is cancelled, as a result, the FET switch 112 is turned off and the power source is no longer supplied to the controller unit 100 (9).

Figure 16:
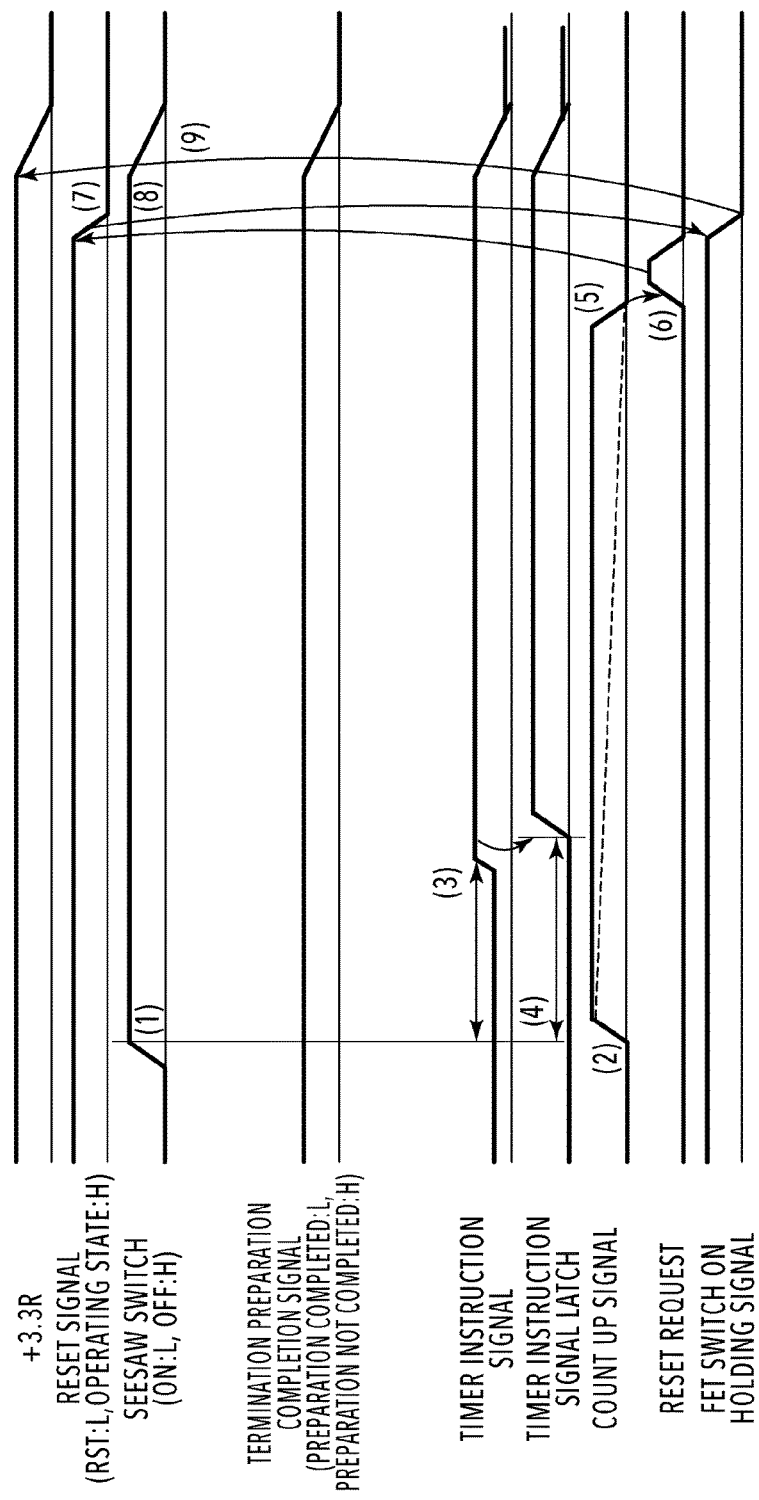
FIG. 16 is a timing chart showing an operation until supply of power source is shut off by a count up signal.

FIG. 16 is a timing chart showing the operation until supply of power source is shut off by a count up signal that is output from the timer 113 as in FIG. 15. In FIG. 16, an example is shown in which 60 [s] longer than that in the example in FIG. 15 is selected and set as the timer time.

In the case where the seesaw switch 111 is switched (that is, control is performed so that the Low level changes to the High level) by a user in the state where the power source is supplied to the controller unit 100 (1), the timer 113 starts the count up operation (2). Next, the timer 113 settles the count time (4) from the timer instruction signal (3) output from the main controller 101 after a predetermined time elapses and latches (holds) the count time as a signal (High level).

After this, in the case where it is determined that the counted time has reached the set count time (60 [s]), the timer 113 performs control so that the count up signal changes from the High level to the Low level and outputs the count up signal to the reset request signal output unit 114 (5).

In the case of detecting that 60 [s] has elapsed and the count up signal has made a transition from the High level to the Low level, the reset request signal output unit 114 outputs a reset request signal to the RST_IC 115 as a pulse signal (6). In the case of detecting the reset request signal, the RST_IC 115 performs control so that the reset signal changes from the High level to the Low level (7).

The seesaw switch ON holding unit 116 cancels the signal supplied from the seesaw switch, which has been held in the on-state (8). Then, in the case where the signal supplied from the seesaw switch, which has been held in the on-state, is cancelled, as a result, the FET switch 112 is turned off and the power source is no longer supplied to the controller unit 100 (9).

As explained above, according to the printing apparatus of the present embodiment of the present invention, on the premise that the power source can be turned off without fail even in the case where the CPU runs out of control, it is possible to guarantee reliability and safety of the printing apparatus by shutting off the power source in accordance with processing being performed.

(Other Embodiments)

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

By the present invention, it is possible to guarantee reliability and safety of the printing apparatus by shutting off the power source in accordance with processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-161499, filed Aug. 24, 2017, which is hereby incorporated by reference wherein in its entirety.

What is claimed is:
1. A printing apparatus comprising:
a power source switch that switches a power source to on or off;
a control circuit configured to control supply or shutoff of power from the power source;
a setting unit configured to set a first set time in a case where first processing is specified as processing performed at the time of switching the power source switch to off, and to set a second set time which is different from the first set time in a case where second processing which is different from the first processing is specified as the processing performed at the time of switching the power source switch to off; and
a measurement unit configured to measure the first set time or the second set time as a predetermined set time after the power source switch is switched to off, wherein
the control circuit performs control, in a case where the power source switch is switched to off, so as to shut off supply of power from the power source in accordance with completion of termination preparation of the pro- cessing being performed or completion of measurement of the predetermined set time in the measurement unit, and the setting unit and the measurement unit are implemented by at least one processor.

2. The printing apparatus according to claim 1, wherein the measurement unit settles the predetermined set time after measurement of a predetermined standby time after the power source switch is switched to off is completed.

3. The printing apparatus according to claim 1, wherein the predetermined set time is set based on a time from the power source being turned off to completion of termination preparation of the processing being performed.

4. The printing apparatus according to claim 1, wherein the predetermined set time is set based on a time required for a process in the processing and a time required for firmware.

5. The printing apparatus according to claim 1, further comprising:

a controller that controls an operation of the printing apparatus, wherein completion of termination preparation of the processing being performed is detected based on a signal that is output from the controller.

6. The printing apparatus according to claim 5, wherein the controller outputs the predetermined set time that is set in accordance with the processing being performed to the measurement unit as a signal.

7. The printing apparatus according to claim 1, wherein the control circuit has an FET switch.

8. The printing apparatus according to claim 1, wherein the printing apparatus is an ink jet printing apparatus that prints an image by ejecting ink onto a printing medium from a print head.

9. The printing apparatus according to claim 1, wherein the termination preparation is processing to complete processing being performed by continuing the processing being performed.

10. The printing apparatus according to claim 1, wherein the termination preparation completes processing being performed by omitting at least part of the processing being performed.

11. The printing apparatus according to claim 1, wherein the first processing is ink circulation or blade wiping, and the second processing is vacuum wiping.

12. The printing apparatus according to claim 1, wherein the first processing is ink circulation or blade wiping, and the second processing is charge suction.

13. The printing apparatus according to claim 1, wherein the second set time is longer than the first set time.

14. A control method in a printing apparatus comprising:
a power source switch that switches a power source to on or off;
a control circuit configured to control supply or shutoff of power from the power source;
a setting unit configured to set a first set time in a case where first processing is specified as processing performed at the time of switching the power source switch to off, and to set a second set time which is different from the first set time in a case where second processing which is different from the first processing is specified as the processing performed at the time of switching the power source switch to off; and
a measurement unit configured to measure the first or second set time as a predetermined set time after the power source switch is switched to off, the control method comprising:

a control step of, by the control circuit, performing control, in a case where the power source switch is switched to off, so as to shut off supply of power from the power source in accordance with completion of termination preparation of processing being performed or completion of measurement of the predetermined set time in the measurement unit.

15. The control method according to claim 14, wherein the predetermined set time is settled after measurement of a predetermined standby time after the power source switch is switched to off is completed.

16. The control method according to claim 14, wherein the predetermined set time is set based on a time from the power source being turned off to completion of termination preparation of the processing being performed.

17. The control method according to claim 14, wherein the predetermined set time is set based on a time required for a process in the processing and a time required for firmware.

18. The control method according to claim 14, wherein completion of termination preparation of the processing being performed is detected based on a signal that is output from a controller that controls an operation of the printing apparatus.

19. The control method according to claim 18, wherein the predetermined set time that is set in accordance with the processing being performed is output to the measurement unit as a signal from the controller.

20. The control method according to claim 14, wherein the control circuit has an FET switch.

21. The control method according to claim 14, wherein the printing apparatus is an ink jet printing apparatus that prints an image by ejecting ink onto a printing medium from a print head.

22. The control method according to claim 14, wherein the termination preparation is processing to complete processing being performed by continuing the processing being performed.

23. The control method according to claim 14, wherein the termination preparation completes processing being performed by omitting at least part of the processing being performed.

24. The control method according to claim 14, wherein the first processing is ink circulation or blade wiping, and the second processing is vacuum wiping.

25. The control method according to claim 14, wherein the first processing is ink circulation or blade wiping, and the second processing is charge suction.

26. The control method according to claim 14, wherein the second set time is longer than the first set time.

* * * * *